`US010511760B2`

United States Patent
Izumi

(10) Patent No.: US 10,511,760 B2
(45) Date of Patent: Dec. 17, 2019

(54) IMAGE SENSOR WITH PHOTOELECTRIC CONVERSION UNITS ARRANGED IN DIFFERENT DIRECTIONS

(71) Applicant: NIKON CORPORATION, Tokyo (JP)

(72) Inventor: Akira Izumi, Yokohama (JP)

(73) Assignee: NIKON CORPORATION, Tokyo (JP)

( * ) Notice: Subject to any disclaimer, the term of this patent is extended or adjusted under 35 U.S.C. 154(b) by 0 days.

(21) Appl. No.: 15/556,011

(22) PCT Filed: Mar. 23, 2016

(86) PCT No.: PCT/JP2016/059233
§ 371 (c)(1),
(2) Date: Sep. 6, 2017

(87) PCT Pub. No.: WO2016/158618
PCT Pub. Date: Oct. 6, 2016

(65) Prior Publication Data
US 2018/0063410 A1    Mar. 1, 2018

(30) Foreign Application Priority Data
Mar. 31, 2015   (JP) .................. 2015-071017

(51) Int. Cl.
H04N 5/232    (2006.01)
H01L 27/28    (2006.01)
(Continued)

(52) U.S. Cl.
CPC ....... *H04N 5/23212* (2013.01); *H01L 27/286* (2013.01); *H01L 27/307* (2013.01);
(Continued)

(58) Field of Classification Search
CPC ........... H04N 5/23212; H04N 5/23258; H04N 5/23229; H04N 5/23254; H04N 5/2258;
(Continued)

(56) References Cited

U.S. PATENT DOCUMENTS

| | | | |
|---|---|---|---|
| 2011/0109776 A1* | 5/2011 | Kawai | H01L 27/14625 348/273 |
| 2013/0182173 A1* | 7/2013 | Murata | H01L 27/14605 348/349 |
| 2014/0022427 A1* | 1/2014 | Goto | H04N 5/2355 348/296 |

FOREIGN PATENT DOCUMENTS

| | | |
|---|---|---|
| CN | 104081245 A | 10/2014 |
| JP | 2001-083407 A1 | 3/2001 |

(Continued)

OTHER PUBLICATIONS

Jun. 14, 2016 Written Opinion issued in International Patent Application No. PCT/JP2016/059233.
(Continued)

*Primary Examiner* — Ahmed A Berhan
(74) *Attorney, Agent, or Firm* — Oliff PLC

(57) ABSTRACT

An imaging device includes: a first image sensor comprising first pixels that receive incident light, and that include a first and second photoelectric conversion units that are arranged in a first direction; and a second image sensor including second pixels that receive light that has passed through the first image sensor, and that include a third and fourth photoelectric conversion units that are arranged in a second direction that is different from the first direction.

19 Claims, 20 Drawing Sheets

(51) Int. Cl.
  *H04N 5/225*   (2006.01)
  *H01L 27/30*   (2006.01)
  *H04N 9/04*    (2006.01)
  *H04N 5/369*   (2011.01)

(52) U.S. Cl.
  CPC ....... *H04N 5/2258* (2013.01); *H04N 5/23229* (2013.01); *H04N 5/23254* (2013.01); *H04N 5/23258* (2013.01); *H04N 5/3696* (2013.01); *H04N 9/045* (2013.01)

(58) Field of Classification Search
  CPC .... H04N 9/045; H04N 5/3696; H01L 27/286; H01L 27/307
  See application file for complete search history.

(56) References Cited

FOREIGN PATENT DOCUMENTS

| | | |
|---|---|---|
| JP | 2007-065330 A | 3/2007 |
| JP | 2009-130239 A | 6/2009 |
| JP | 2015-162562 A | 9/2015 |
| WO | 2013/105481 A1 | 7/2013 |

OTHER PUBLICATIONS

Jun. 14, 2016 International Search Report issued in International Patent Application No. PCT/JP2016/059233.
Sep. 4, 2019 Office Action issued in Chinese Patent Application No. 201680027016.9.

\* cited by examiner

FIG.16
(a)
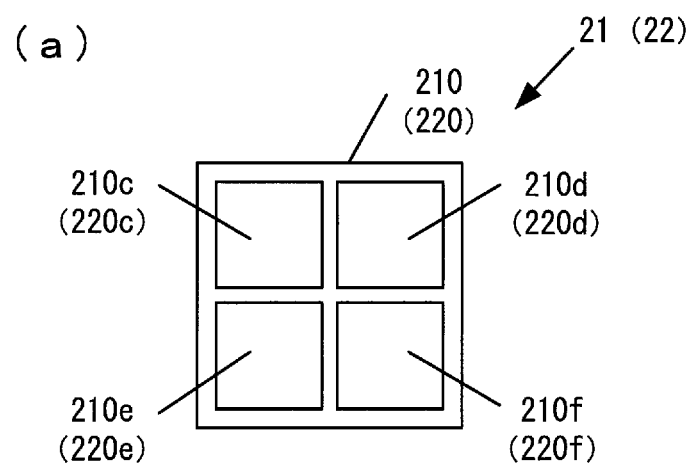
(b)
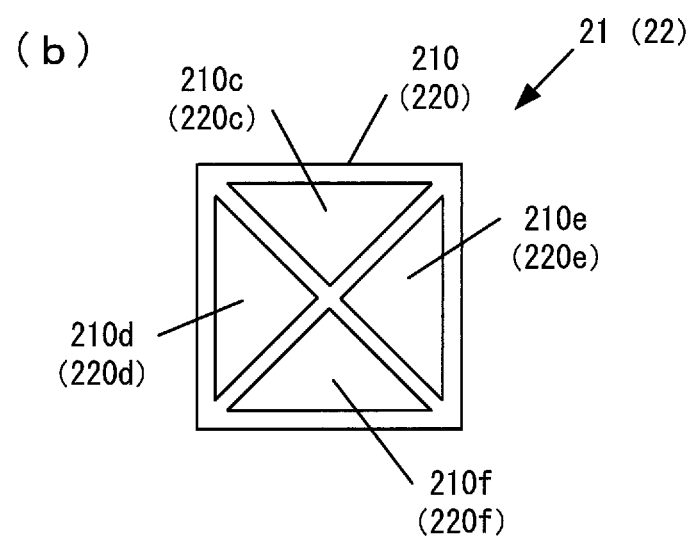

FIG.17
(a)
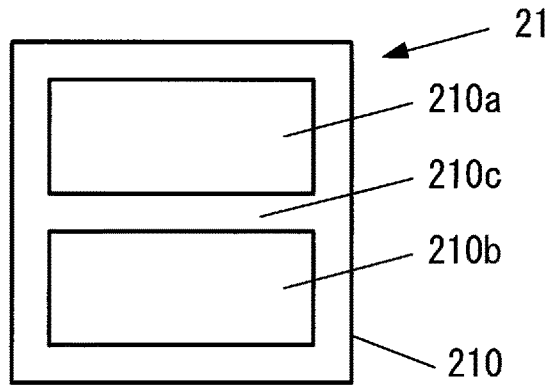
(b)
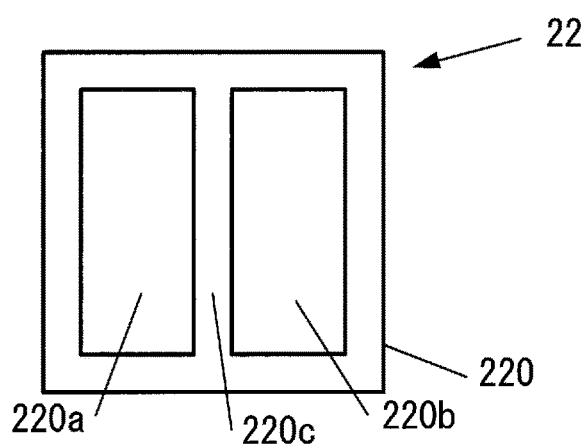
(c)
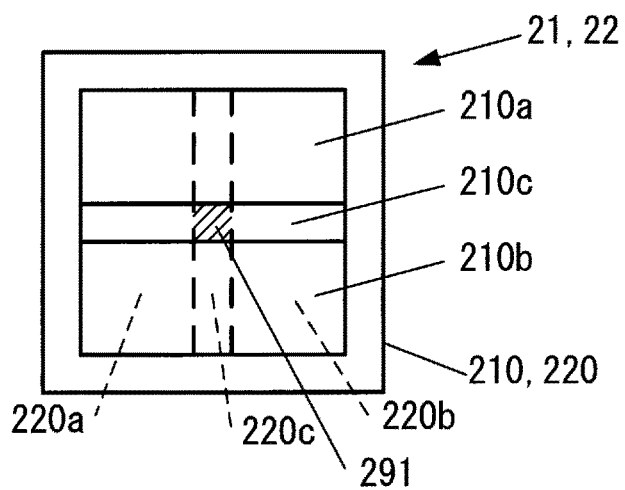

FIG.19
(a)
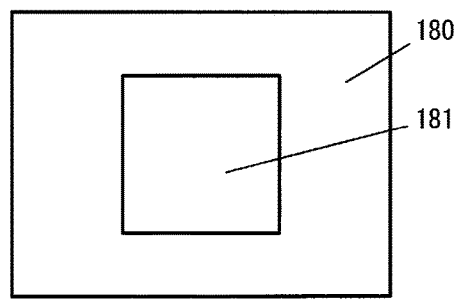
(b)
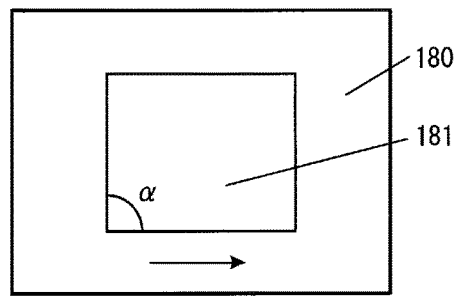
(c)
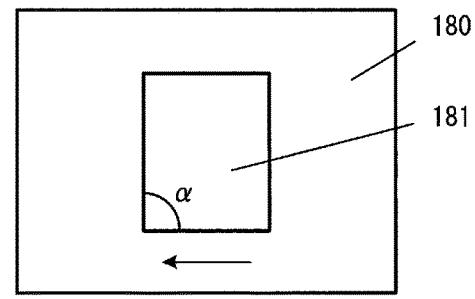
(d)
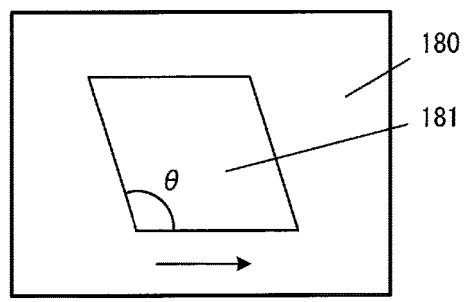
(e)
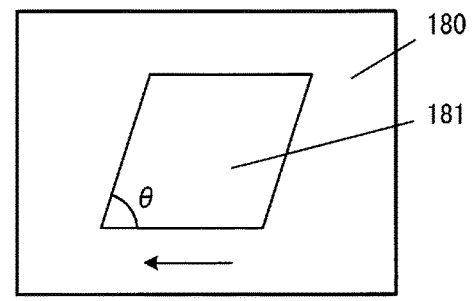

IMAGE SENSOR WITH PHOTOELECTRIC CONVERSION UNITS ARRANGED IN DIFFERENT DIRECTIONS

TECHNICAL FIELD

The present invention relates to an imaging device.

BACKGROUND ART

A digital camera that is equipped with an image sensor, with pixels each of which has a micro lens and first and second photoelectric conversion units are arranged two dimensionally on the image sensor, is per se known (refer to Patent Document #1). Along with performing phase difference method focus detection according to first and second photoelectrically converted signals from the first and second photoelectric conversion units, this digital camera also generates an image by adding together the first and second photoelectrically converted signals for each pixel. In phase difference focus detection, for making such focus detection possible on the basis of a pair of images that are formed by the pupil split in two mutually different directions, for example a pair of images that are pupil-divided in the vertical direction and in the horizontal direction, accordingly the image sensor has first pixels in which the first and second photoelectric conversion units are arranged in series in the horizontal direction, and second pixels in which the first and second photoelectric conversion units are arranged in series in the vertical direction. Due to the provision of first and second pixels of these types, satisfactory phase difference focus detection is enabled even for photographic subject patterns that include many vertically striped patterns or many horizontally striped patterns.

CITATION LIST

Patent Literature

Patent Document #1: Japanese Laid-Open Patent Publication 2007-65330.

SUMMARY OF INVENTION

Technical Problem

There is the problem that the digital camera described above is not capable of splitting the same image of the photographic subject in different directions by the spilt pupil.

Solution to Problem

According to the 1st aspect of the present invention, an imaging device comprises: a first image sensor comprising first pixels that receive incident light, and that comprise first and second photoelectric conversion units that are arranged in a first direction; and a second image sensor comprising second pixels that receive light that has passed through the first image sensor, and that comprise third and fourth photoelectric conversion units that are arranged in a second direction that is different from the first direction.

According to the 2nd aspect of the present invention, it is preferable that in the imaging device according to the 1st aspect, the first image sensor photoelectrically converts light of a first color among the incident light; and the second image sensor photoelectrically converts light of a complementary color to the first color.

According to the 3rd aspect of the present invention, it is preferable that in the imaging device according to the 1st or 2nd aspect, the first image sensor comprises a plurality of the first pixels arranged two dimensionally; and the second image sensor comprises a plurality of the first pixels arranged two dimensionally; and the imaging device further comprises: a first readout unit that reads out signals from a plurality of the first pixels that are arranged in the second direction; and a second readout unit that reads out signals from a plurality of the second pixels that are arranged in the first direction.

According to the 4th aspect of the present invention, the imaging device according to any one of the 1st through 3rd aspects may further comprise: a micro lens that has a focal point between the first image sensor and the second image sensor, and that is disposed at a light incident side of each of the first pixels.

According to the 5th aspect of the present invention, the imaging device according to any one of the 1st through 3rd aspects may further comprise: a micro lens that has a focal point upon the first image sensor or upon the second image sensor, and that is disposed at a light incident side of each of the first pixels.

According to the 6th aspect of the present invention, the imaging device according to any one of the 1st through 3rd aspects may further comprise: a micro lens disposed at a light incident side of each of the first pixels; and an inner lens disposed between the first image sensor and the second image sensor for each of the second pixels.

According to the 7th aspect of the present invention, it is preferable that in the imaging device according to any one of the 1st through 3rd aspects, the first through fourth photoelectric conversion units are organic photoelectric sheets.

According to the 8th aspect of the present invention, it is preferable that in the imaging device according to any one of the 1st through 3rd aspects, the incident light is a light flux that has passed through a photographic optical system; and the imaging device further comprises: a focus detection unit that detects the focus adjustment state of the photographic optical system on the basis of a first signal from the first photoelectric conversion unit and a second signal from the second photoelectric conversion unit, and that detects the focus adjustment state of the photographic optical system on the basis of a third signal from the third photoelectric conversion unit and a fourth signal from the fourth photoelectric conversion unit; and an image signal generation unit that generates an image signal by adding together the first signal and the second signal, and generates an image signal by adding together the third signal and the fourth signal.

According to the 9th aspect of the present invention, the imaging device according to the 8th aspect may further comprise: a selection unit that selects whether to perform focus adjustment of the photographic optical system on the basis of the focus adjustment state detected by the focus detection unit on the basis of the first and second signals, or to perform focus adjustment of the photographic optical system on the basis of the focus adjustment state detected by the focus detection unit on the basis of the third and fourth signals.

According to the 10th aspect of the present invention, the imaging device according to the 8th aspect may further comprise: a combining unit that combines together an image signal generated by the image signal generation unit by adding together the first signal and the second signal, and an image signal generated by the image signal generation unit by adding together the third signal and the fourth signal.

According to the 11th aspect of the present invention, the imaging device according to any one of the 1st through 3rd aspects may further comprise: a moving direction detection unit that detects a direction of moving of a photographic subject according to at least one of signals from the first pixels and signals from the second pixels; and an image signal selection unit that selects one of an image signal due to the signals from the first pixels and an image signal due to the signals from the second pixels, on the basis of the direction of moving of the photographic subject detected by the moving direction detection unit.

According to the 12th aspect of the present invention, the imaging device of any one of the 1st through 3rd aspects may further comprise: a moving direction detection unit that detects a direction of moving of a photographic subject according to at least one of signals from the first pixels and signals from the second pixels; and a correction unit that corrects one of a first image due to the signals from the first pixels and a second image due to the signals from the second pixels, on the basis of the direction of moving of the photographic subject detected by the moving direction detection unit.

BRIEF DESCRIPTION OF DRAWINGS

FIG. 16(a) is a figure showing a variant embodiment of the pixels of the first and second image sensors, and FIG. 16(b) is a figure showing another variant embodiment of the pixels of the first and second image sensors;

FIG. 17 is a figure for explanation of the fundamental concept of a second embodiment: FIG. 17(a) is a figure showing a pixel of a first image sensor; FIG. 17(b) is a figure showing a pixel of a second image sensor; and FIG. 17(c) is a figure in which pixels of the first and second image sensors that are in a relationship of correspondence are shown as mutually superimposed;

FIG. 18(a) is a figure showing pixels of a portion of the first image sensor, FIG. 18(b) is a figure showing the relationship between RGB image signals and the pixels of the first image sensor, FIG. 18(c) is a figure showing pixels of a portion of the second image sensor, and FIG. 18(d) is a figure in which these pixels of the first and second image sensors that are in a corresponding relationship are shown as mutually superimposed, and schematically shows the relationship between the overlapped pixels and their added signals;

FIG. 19 is a figure for explanation of the theory of a third embodiment: FIG. 19(a) is an image that has been obtained by capturing an image of a photographic subject that is stationary, FIG. 19(b) is an image that has been obtained by capturing, with a first image sensor, an image of a photographic subject that is moving in the direction of an arrow sign, FIG. 19(c) is an image that has been obtained by capturing, with the first image sensor, an image of a photographic subject that is moving in the direction of an arrow sign, FIG. 19(d) is an image that has been obtained by capturing, with a second image sensor, an image of a photographic subject that is moving in the direction of an arrow sign, and FIG. 19(e) is an image that has been obtained by capturing, with the second image sensor, an image of a photographic subject that is moving in the direction of an arrow sign.

DESCRIPTION OF EMBODIMENTS

Embodiment #1

Figure 1:
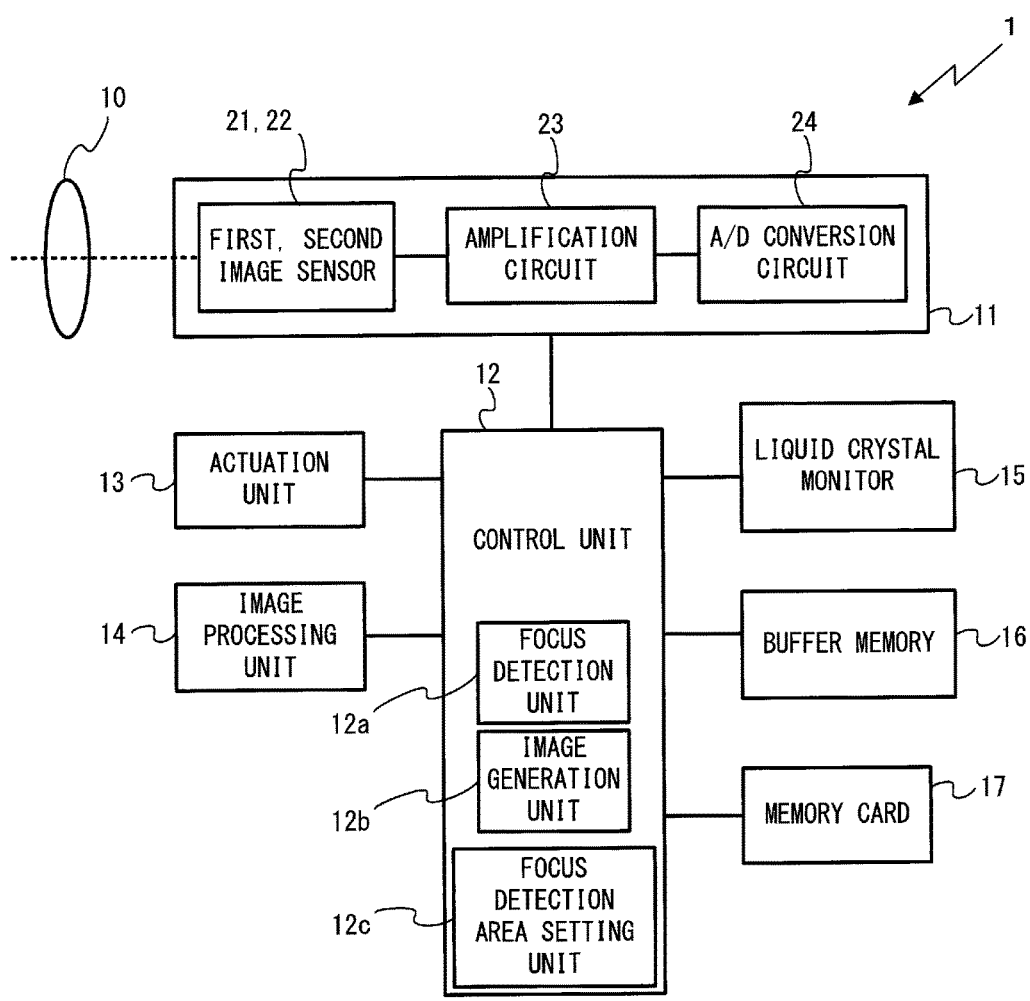
FIG. 1 is a figure showing an example of the structure of a digital camera according to a first embodiment.

FIG. 1 is a figure showing an example of the structure of a digital camera 1 according to the first embodiment. This digital camera 1 comprises a photographic optical system 10, an image capturing unit 11, a control unit 12, an actuation unit 13, an image processing unit 14, a display such as a liquid crystal or an EL or the like, in other words a monitor 15, and a buffer memory 16. Moreover, a memory card 17 is installed to the digital camera 1. This memory card 17 incorporates a non-volatile flash memory or the like, and can be removable from the digital camera 1.

The photographic optical system 10 comprises a plurality of lenses, and forms an image of a photographic subject upon a photographic image surface of an image capturing unit 11. A focusing lens that is driven along the direction of the optical axis for focus adjustment is included in the plurality of lenses that make up the photographic optical system 10. This focusing lens is driven along the direction of the optical axis by a lens drive unit not shown in the figures.

The image capturing unit 11 comprises a first image sensor 21 and a second image sensor 22 that are mutually laminated together, an amplification circuit 23, and an A/D conversion circuit 24. Each of the first and second image sensors 21, 22 is built from a plurality of pixels that are arranged two dimensionally, and receives incident light, in other words a light flux of visible light, from the photographic subject via the photographic optical system 10, performs photoelectric conversion upon that light, and outputs a photoelectrically converted signal. As will be described hereinafter, each of the pixels of the first and second image sensors 21, 22 comprises first and second photoelectric conversion units that respectively receive a pair of light fluxes that have passed through a pair of regions of the pupil of the photographic optical system 10, and these first and second photoelectric conversion units of each pixel respectively output first and second photoelectrically converted analog signals. And, as will be described hereinafter, along with the first and second photoelectrically converted signals being employed as signals for phase difference method focus detection, they are also employed as signals for imaging.

The amplification circuit 23 amplifies the first and second photoelectrically converted signals by predetermined amplification ratios (i.e., gains) and outputs the results to the A/D conversion circuit 24. And the A/D conversion circuit 24 performs A/D conversion upon the first and second photoelectrically converted signals.

The control unit 12 comprises a microprocessor and peripheral circuitry thereof, and performs various types of control for the digital camera 1 by executing a control program that is stored in a ROM not shown in the figures. Moreover, the control unit 12 is endowed with the functions of a focus detection unit 12a, an image generation unit 12b, and a focus detection area setting unit 12c. Each of these functional units 12a, 12b, and 12c is implemented in software by the control program described above. It should be understood that it would also be acceptable for these functional units to be implemented by electronic circuitry.

The control unit 12 stores the first and second photoelectrically converted signals that have been A/D converted by the A/D conversion circuit 24 in the buffer memory 16. And the focus detection unit 12a detects the focus adjustment state of the photographic optical system 10 on the basis of the first and second photoelectrically converted signals of the first image sensor 21 stored in the buffer memory 16, and on the basis of the first and second photoelectrically converted signals of the second image sensor 22 stored in the buffer memory 16.

The image generation unit 12b generates image signals on the basis of the first and second photoelectrically converted signals of both the first and second image sensors 21, 22 stored in the buffer memory 16. In other words, the image generation unit 12b generates first image signals by adding together the first and second photoelectrically converted signals of the pixels of the first image sensor 21, and also generates second image signals by adding together the first and second photoelectrically converted signals of the pixels of the second image sensor 22.

The image processing unit 14 incorporates an ASIC and so on. The image processing unit 14 performs image processing of various kinds upon the first and second image signals from the image generation unit 12b, such as interpolation processing, compression processing, white balance processing and so on, and generates first and second image data. This first and second image data may be displayed upon the monitor 15, and/or may be stored upon the memory card 17.

The actuation unit 13 comprises actuation members of various types, such as a release actuation member, a mode changeover actuation member, an actuation member that is used for setting a focus detection area, a power supply actuation member, and so on, and is actuated by the photographer. And the actuation unit 13 outputs actuation signals to the control unit 12 according to actuation by the photographer of the various actuation members described above.

And, according to actuation of the actuation member for focus detection area setting, the focus detection area setting unit 12c sets the focus detection area of a predetermined region within the photographic scene. As will be described in detail hereinafter, various possible methods are available as the setting method for the focus detection area by the focus detection area setting unit 12c and the actuation member for focus detection area setting. For example, when the photographer actuates the actuation member for focus detection area setting, the focus detection area setting unit 12c may set the focus detection area with a predetermined region on any desired position in the photographic scene, according to this actuation of the actuation member for focus detection area setting. Or alternatively, focus detection areas may be prepared in advance for a plurality of spots in the photographic scene, and, when the photographer actuates the actuation member for focus detection area setting and selects one focus detection area from this plurality of focus detection areas, the focus detection area setting unit 12c may set the focus detection area according to this selection. Furthermore, if the digital camera 1 includes a photographic subject recognition unit that recognizes from a captured image, the face of a person or the like that is the photographic subject, then the focus detection area setting unit 12c may set the focus detection area to this face portion when the face of a person who is the photographic subject is recognized by the photographic subject recognition unit. In this case, the actuation member for focus detection area setting becomes an actuation member for selecting the mode for automatically setting the focus detection area, according to the result of facial recognition of the person who is the photographic subject by the photographic subject recognition unit. It should be understood that the focus detection area that, as described above, has been set by the focus detection area setting unit 12c as the focus detection subject region will be termed the "set focus detection area".

Explanation of the First and Second Image Sensors 21, 22

Figure 2:
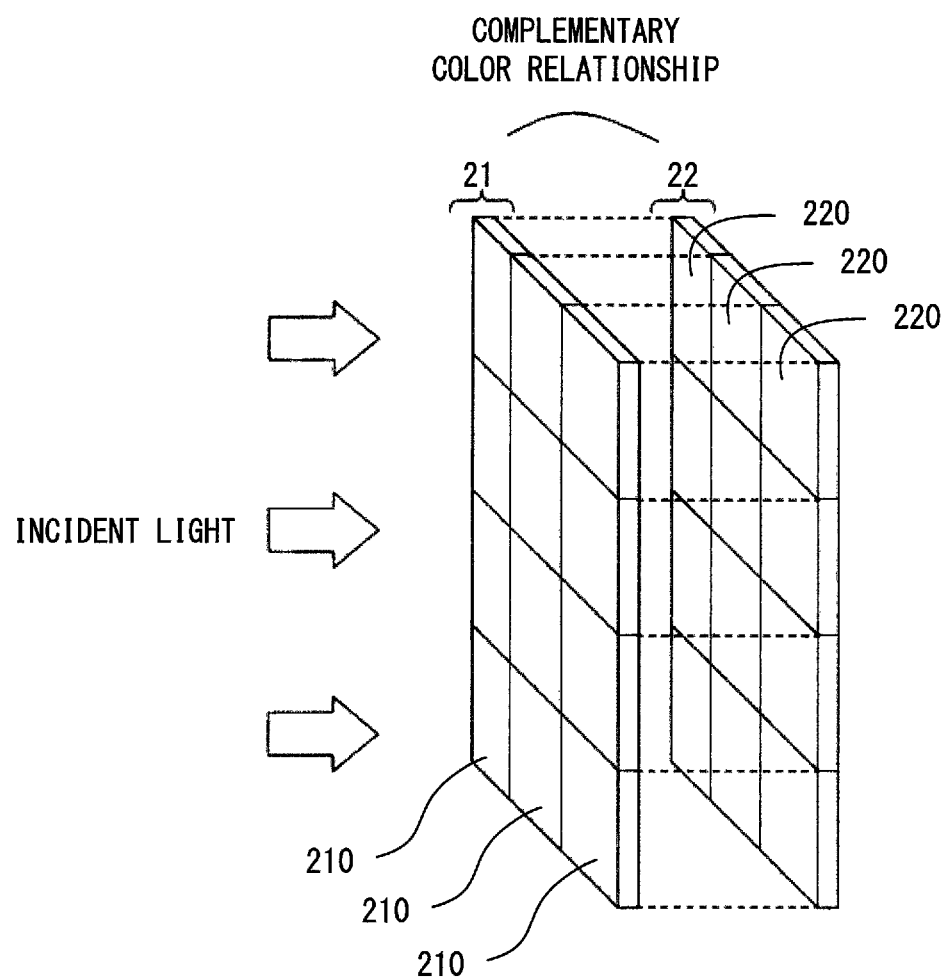
FIG. 2 is a figure showing general sketches of a first and a second image sensor.

FIG. 2 is a figure showing general sketches of the first and second image sensors 21, 22 according to this embodiment. The first image sensor 21 is an image sensor that uses organic photoelectric sheets as photoelectric conversion units, and the second image sensor 22 is an image sensor that uses photodiodes formed upon a semiconductor substrate as photoelectric conversion units. The first image sensor 21 is laminated over the second image sensor 22, and the first and second image sensors 21, 22 are disposed upon the optical path of the photographic optical system 10 so that the optical axis of the photographic optical system 10 shown in FIG. 1 passes through the centers of the photographic image surfaces of each of the first and second image sensors 21, 22. It should be understood that although, in FIG. 2, in order to avoid complication, only four rows by three columns of the pixels 210, 220 of the first and second image sensors 21, 22 are shown, in this first embodiment, both of these elements comprise m rows by n columns of pixels, and the pixels of the first image sensor 21 are of the same size as the pixels of the second image sensor 22.

Each of the pixels 210 of the first image sensor 210 includes an organic photoelectric sheet that absorbs (and photoelectrically converts) light of a predetermined color component. And the color components that are not absorbed (photoelectrically converted) by the first image sensor 21 pass through the first image sensor 21 and are incident upon the second image sensor 22, and are photoelectrically converted by the second image sensor 22. It should be understood that the color components that are photoelectrically converted by the first image sensor 21 and the color components that are photoelectrically converted by the second image sensor 22 are in complementary color relationship. In other words, as will be described hereinafter, light of the green color component, which is in a complementary color relationship with magenta, is incident upon the pixels 220 of the second image sensor 22 that are positioned directly behind those pixels, among the pixels 210 of the first image sensor 21, that absorb and photoelectrically convert the magenta color component. Similarly, light of the blue color component, which is in a complementary color relationship with yellow, is incident upon the pixels 220 of the second image sensor 22 that are positioned directly behind those pixels, among the pixels 210 of the first image sensor 21, that absorb and photoelectrically convert the yellow color component. And light of the red color component, which is in a complementary color relationship with cyan, is incident upon the pixels 220 of the second image sensor 22 that are positioned directly behind those pixels, among the pixels 210 of the first image sensor 21, that absorb and photoelectrically convert the cyan color component.

In this manner, there is a correspondence relationship between each of the pixels 210 of the first image sensor 21 and the pixel 220 of the second image sensor that is positioned directly behind that pixel 210, in other words, there is a correspondence relationship between each of the pixels 210 of the first image sensor 21 and the pixel 220 of the second image sensor 22 that receives the light flux that has passed through that pixel 210; and the pixels 210, 220 of the first and second image sensors 21, 22 that are in this sort of correspondence relationship absorb and photoelectrically convert color components that are in a mutually complementary color relationship. Pixels 210, 220 of the first and second image sensors 21, 22 that are in this sort of correspondence relationship will hereinafter be termed "correspondingly related pixels".

Figure 3:
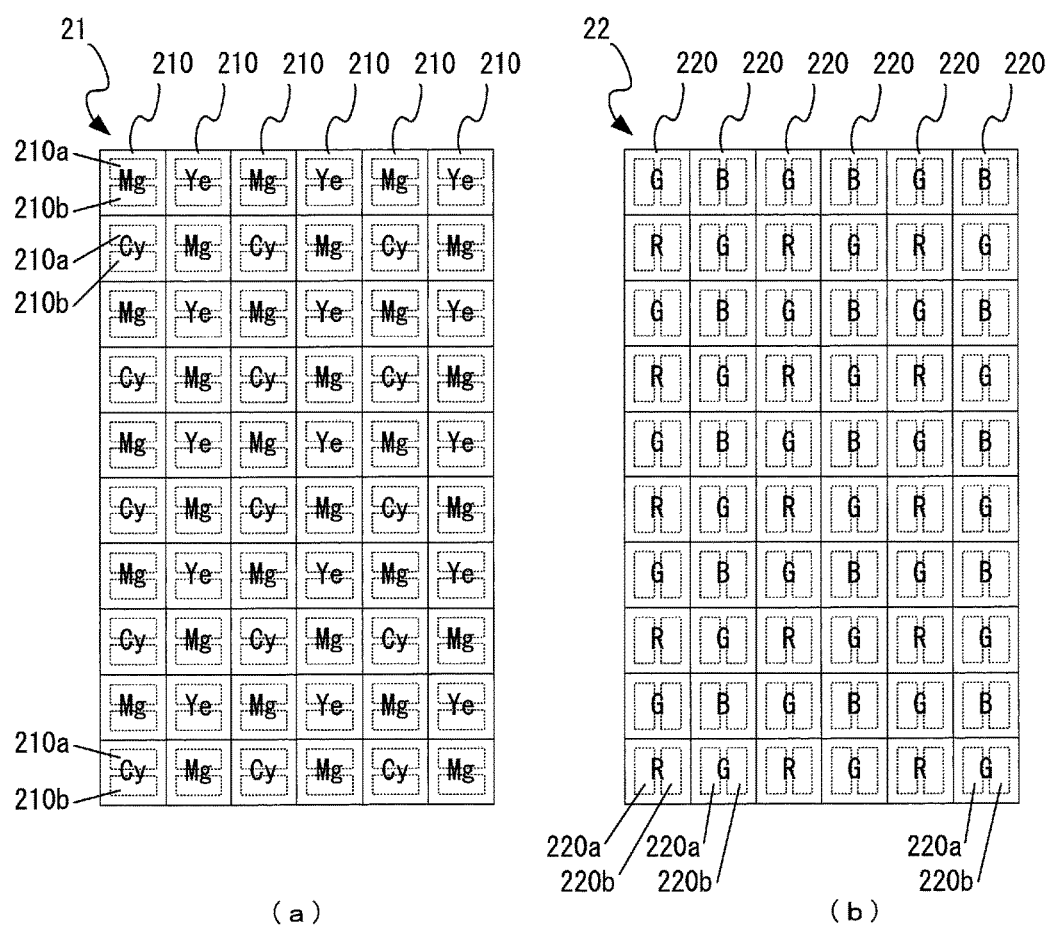
FIG. 3(a) is a figure showing the configuration of a portion of the first image sensor that is 10 rows by 6 columns.
FIG. 3(b) is a figure showing the configuration of a portion of the second image sensor that is 10 rows by 6 columns.

FIG. 3 consists of two figures respectively showing the configuration of 10 rows by 6 columns of pixels 210 of a portion of the first image sensor 21, and the configuration of 10 rows by 6 columns of pixels 220 of a portion of the second image sensor 22. In FIG. 3(*a*), for the first image sensor 21, the notation "Mg" that is appended to some of the pixels 210 means that those pixels are pixels that absorb and photoelectrically convert the magenta color component, in other words, means that those pixels are pixels that have spectral sensitivity to magenta; and, in a similar manner, the notation "Ye" that is appended to some of the pixels 210 means that those pixels are pixels that absorb and photoelectrically convert the yellow color component, in other words, means that those pixels are pixels that have spectral sensitivity to yellow; and the notation "Cy" that is appended to some of the pixels 210 means that those pixels are pixels that absorb and photoelectrically convert the cyan color component, in other words, means that those pixels are pixels that have spectral sensitivity to cyan. In the odd numbered pixel rows of this first image sensor 21, "Mg" pixels 210 and "Ye" pixels 210 are arranged in sequence alternatingly; and, in the even numbered pixel rows, "Cy" pixels 210 and "Mg" pixels 210 are arranged in sequence alternatingly.

It should be understood that generally the "Mg" pixels 210 are not able to absorb 100% of the magenta color component, generally the "Ye" pixels 210 are not able to absorb 100% of the yellow color component, and generally the "Cy" pixels 210 are not able to absorb 100% of the cyan color component, and some amounts of those color components inevitably pass through those pixels, although this is not particularly desirable.

In FIG. 3(*b*) for the second image sensor 22, the notation "G" that is appended to some of the pixels 220 means that those pixels are pixels that absorb and photoelectrically convert the green color component, in other words, means that those pixels are pixels that have spectral sensitivity to green; and, in a similar manner, the notation "B" that is appended to some of the pixels 220 means that those pixels are pixels that absorb and photoelectrically convert the blue color component, in other words, means that those pixels are pixels that have spectral sensitivity to blue; and the notation "R" that is appended to some of the pixels 220 means that those pixels are pixels that absorb and photoelectrically convert the red color component, in other words, means that those pixels are pixels that have spectral sensitivity to red. In the odd numbered pixel rows of this second image sensor 22, "G" pixels 220 and "B" pixels 220 are arranged in sequence alternatingly; and, in the even numbered pixel rows, "R" pixels 220 and "G" pixels 220 are arranged in sequence alternatingly. In other words, the pixels in the second image sensor 22 are arranged to form a Bayer array.

In FIGS. 3(*a*) and 3(*b*), the "Mg" pixels 210 of the first image sensor 21 and the "G" pixels 220 of the second image sensor 22 are in a mutually corresponding relationship, the "Ye" pixels 210 of the first image sensor 21 and the "B" pixels 220 of the second image sensor 22 are in a mutually corresponding relationship, and the "Cy" pixels 210 of the first image sensor 21 and the "R" pixels 220 of the second image sensor 22 are in a mutually corresponding relationship.

In this manner, the first image sensor 21 that is built from organic photoelectric sheets fulfils the role of a color filter with respect to the second image sensor 22, and a color image that is complementary to that of the first image sensor 21 (in the example of FIG. 3, a Bayer array image) is received from the second image sensor 22. Accordingly, it is possible to acquire a CMY image that consists of the three colors Cy, Mg, and Ye from the first image sensor 21, and it is possible to acquire a RUB image that consists of the three colors R, G, and B from the second image sensor 22. Since the first image sensor 21 operates in this manner as a replacement for a color filter such as is required for a prior art image sensor, accordingly it is possible to employ the incident light which would undesirably be absorbed by a color filter more effectively with the first image sensor 21. It should be understood that the CMY image from the first image sensor 21 is converted into an RGB image by per se known color system conversion processing as will be described in detail hereinafter, and thus becomes a first image signal.

Next, the positional relationship of the first and second photoelectric conversion units of the pixels 210 of the first image sensor 21 and the positional relationship of the first and second photoelectric conversion units of the pixels 220 of the second image sensor 22 will be explained. In FIG.

3(*a*), each pixel 210 of the first image sensor 21 has a first photoelectric conversion unit 210*a* and a second photoelectric conversion unit 210*b*. These first and second photoelectric conversion units 210*a* and 210*b* are arranged in the column direction, in other words in the vertical direction in FIG. 3(*a*). Moreover, in FIG. 3(*b*), each pixel 220 of the second image sensor 22 has a first photoelectric conversion unit 220*a* and a second photoelectric conversion unit 220*b*. These first and second photoelectric conversion units 220*a* and 210*b* are arranged in the row direction, in other words in the horizontal direction in FIG. 3(*b*). Thus, as described above, the first and second photoelectric conversion units 210*a*, 210*b* of the pixels 210 of the first image sensor 21 and the first and second photoelectric conversion units 220*a*, 220*b* of the pixels 220 of the second image sensor 22 are arranged in mutually orthogonal directions.

Moreover, as will be described hereinafter, in the first image sensor 21, the first and second photoelectrically converted signals from the first and second photoelectric conversion units 210, 210*b* of the pixels 210 are read out in units of columns. In other words, for example, for this first image sensor 21, the first and second photoelectrically converted signals of the ten pixels 210 positioned in the extreme left column are read out simultaneously; next, the first and second photoelectrically converted signals of the ten pixels 210 positioned next to the extreme left column and on its right are read out simultaneously; and subsequently, in a similar manner, the first and second photoelectrically converted signals of the ten pixels 210 positioned in the next column rightward are read out, and so on in sequence.

On the other hand, in the second image sensor 22, the first and second photoelectrically converted signals from the first and second photoelectric conversion units 220, 220*b* of the pixels 220 are read out in units of rows. In other words, for example, for this second image sensor 22, the first and second photoelectrically converted signals of the six pixels 220 positioned in the extreme upper row are read out simultaneously; next, the first and second photoelectrically converted signals of the six pixels 220 positioned in the row below that extreme upper row are read out simultaneously; and subsequently, in a similar manner, the first and second photoelectrically converted signals of the six pixels 220 positioned in the next lower row are read out, and so on in sequence.

It should be understood that an example of the circuitry for the pixels 210 of the first image sensor 21 is, for example, disclosed in International Laying-Open Publication 2013/105,481.

Figure 4:
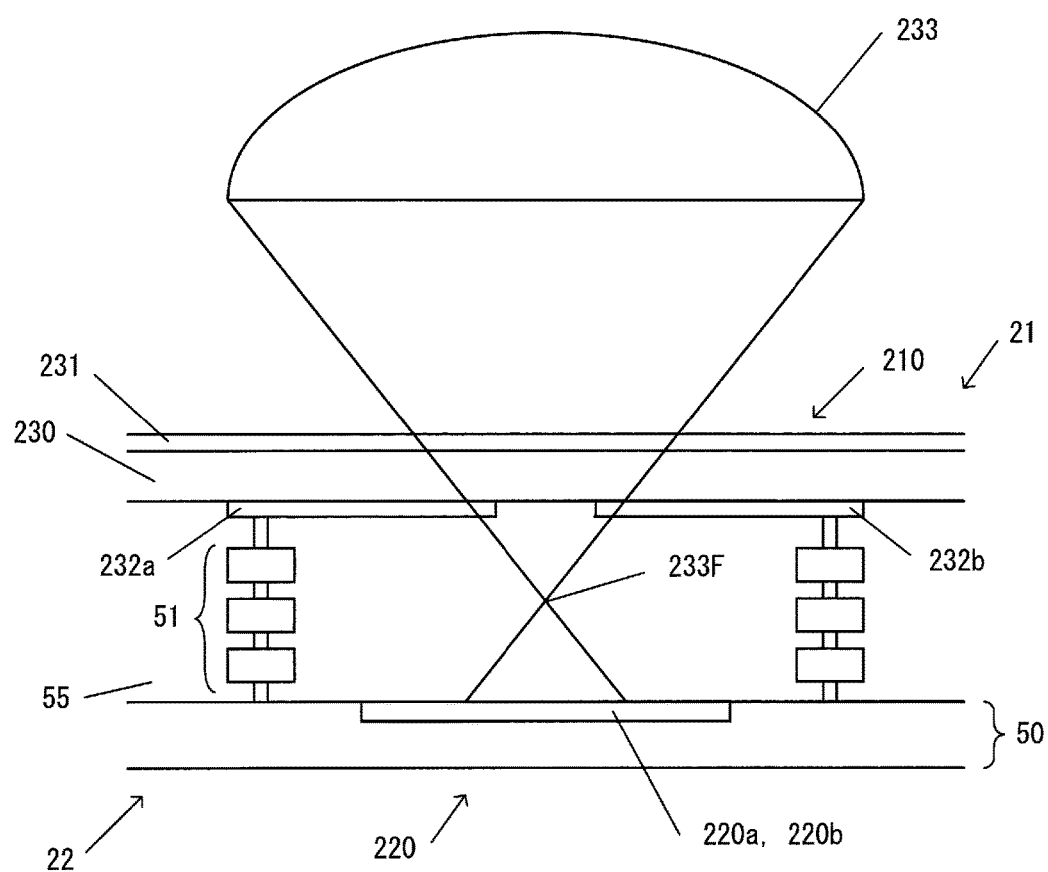
FIG. 4 is a sectional view showing the structure of pixels of the first and second image sensors.

FIG. 4 is a sectional view showing the structure of respective pixels 210, 220 of the first and second image sensors 21, 22. As shown in FIG. 4, the second image sensor 22 is formed upon a semiconductor substrate 50, and each of its pixels 220 comprises the first and second photoelectric conversion units 220*a*, 220*b* that are arranged along the vertical direction. And, via a flattening layer 55, the first image sensor 21 is laminated to the front surface of the second image sensor 22, in other words to its upper surface. A wiring layer 51 is provided within this flattening layer 55. It should be understood that while, in FIG. 4, the wiring layer 51 has a three-layered structure, it would also be acceptable for it to have a two-layered structure.

Each of the pixels 210 of the first image sensor 21 comprises an organic photoelectric sheet 230, a transparent common electrode 231 that is formed on the upper surface of the organic photoelectric sheet 230, and transparent first and second partial electrodes 232*a*, 232*b* that are formed on the lower surface of the organic photoelectric sheet 230. As described above, the first and second partial electrodes 232*a*, 232*b* are arranged along the left to right direction on the drawing paper, in other words in the direction orthogonal to the direction along which the first and second photoelectric conversion units 220*a*, 220*b* of the second image sensor 22 are arranged. In each of the pixels 210 of the first image sensor 21, the organic photoelectric sheet 230, the common electrode 231, and the first partial electrode 232*a* constitute the first photoelectric conversion unit 210*a*, while the organic photoelectric sheet 230, the common electrode 231, and the second partial electrode 232*b* constitute the second photoelectric conversion unit 210*b*.

Moreover, a micro lens 233 is disposed over each of the pixels 210 of the first image sensor 21, and each of the micro lenses 233, the corresponding pixel 210 of the first image sensor 21, and the corresponding pixel 220 of the second image sensor 22 are arranged in series along the direction of the optical axis of that micro lens 233.

Furthermore, the focal point 233F of the micro lens 233 is positioned at the middle between the first image sensor 21 and the second image sensor 22. In other words, the distance between the focal plane of the micro lens 233 (in other words the plane orthogonal to the optical axis of the micro lens 233 that includes the focal point F) and the first and second photoelectric conversion units of the first image sensor 21 is set so as to be equal to the distance between the focal plane of the micro lens 233 and the first and second photoelectric conversion units of the second image sensor 22. Since the gap between the first and second image sensors 21, 22 is comparatively small, and since moreover, as described above, the focal point 233F of the micro lens 233 is positioned at the middle between the first image sensor 21 and the second image sensor 22, accordingly the plane that is conjugate to the first and second photoelectric conversion units of the first image sensor 21 with respect to the micro lens 233 (hereinafter this conjugate plane will be referred to as the "first focus detection pupil plane") is located, along the direction of the optical axis of the photographic optical system 10 shown in FIG. 1, in the vicinity of the plane that is conjugate to the first and second photoelectric conversion units of the second image sensor 22 with respect to the micro lens 233 (hereinafter this conjugate plane will be referred to as the "second focus detection pupil plane"). In other words, the first and the second focus detection pupil planes are positioned near one another in the vicinity along the direction of the optical axis of the photographic optical system 10.

Since the micro lens 233 and the first and second image sensors 21, 22 are arranged as described above, accordingly the first and second photoelectric conversion units 210*a*, 210*b* of each pixel 210 of the first image sensor 21 respectively receive a pair of light fluxes that have respectively passed through first and second pupil regions of the first focus detection pupil plane, while the first and second photoelectric conversion units 220*a*, 220*b* of each pixel 220 of the second image sensor 22 respectively receive a pair of light fluxes that have respectively passed through third and fourth pupil regions of the second focus detection pupil plane. It should be understood that the direction along which the first and second pupil regions of the first focus detection pupil plane are arranged and the direction along which the third and fourth pupil regions of the second focus detection pupil plane are arranged are mutually orthogonal.

On the basis of the first and second photoelectrically converted signals of the plurality of pixels 210 that are arranged in the column direction of the first image sensor 21, as will be described hereinafter, the focus detection unit 12*a* shown in FIG. 1 detects the amounts of deviation between the pairs of images that are formed by the pairs of light fluxes that have passed through the first and second pupil regions, in other words detects their phase differences, and calculates a defocus amount on the basis of this amount of image deviation. Moreover, on the basis of the first and second photoelectrically converted signals of the plurality of pixels 220 that are arranged in the row direction of the second image sensor 22, the focus detection unit 12a detects the amounts of deviation between the pairs of images that are formed by the pairs of light fluxes that have passed through the third and fourth pupil regions, and calculates a defocus amount on the basis of this amount of image deviation.

Circuit Structure of the Image Sensor 21

Figure 5:
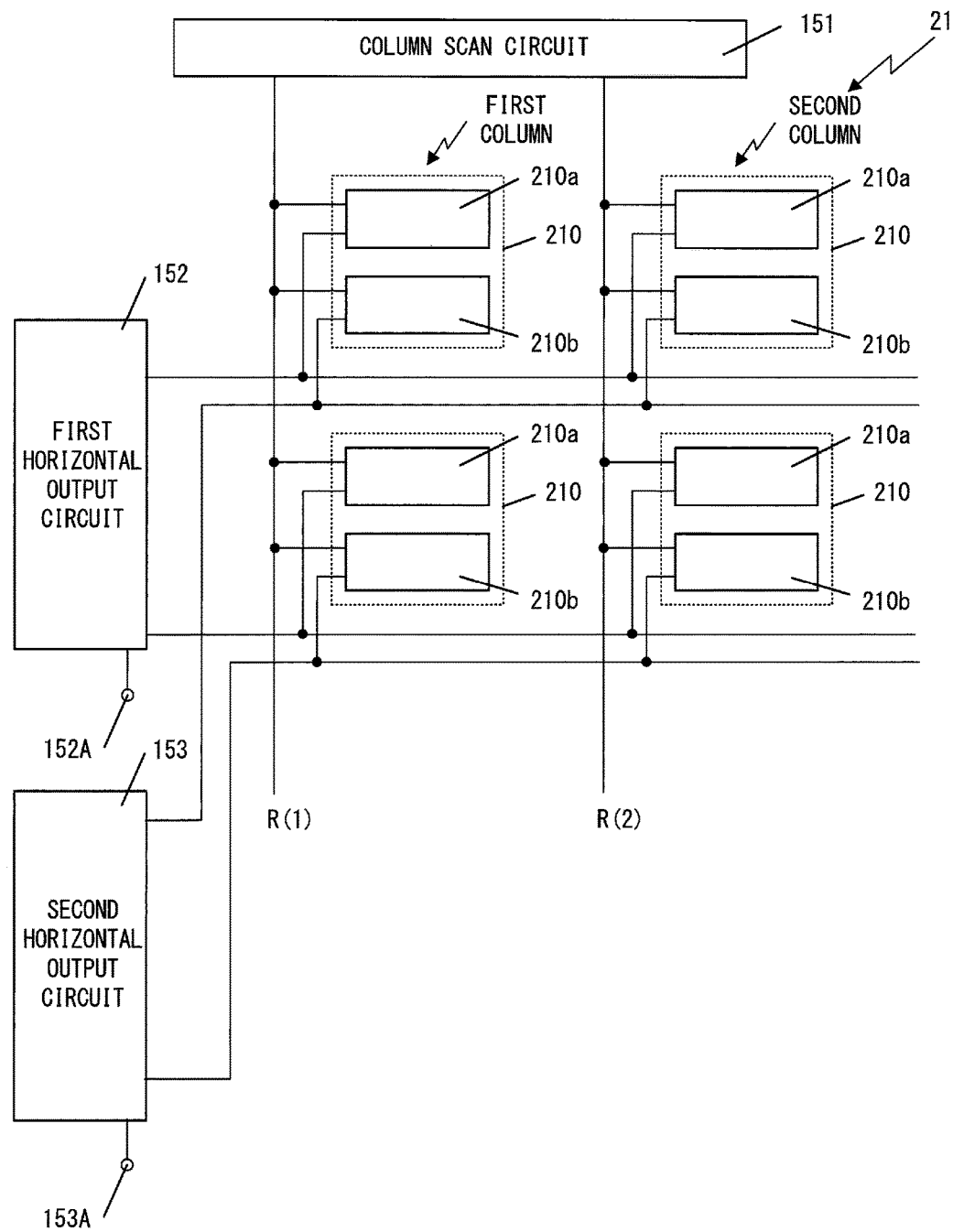
FIG. 5 is a figure showing a simplified readout circuit for the photoelectrically converted signals of the first and second photoelectric conversion units of the pixels of the first image sensor.

FIG. 5 is a figure showing a simplified readout circuit for the photoelectrically converted signals of the first and second photoelectric conversion units 210a and 210b of the pixels 210 of the first image sensor 21. In FIG. 5, the first image sensor 21 comprises a column scan circuit 151 and first and second horizontal output circuits 152, 153. The column scan circuit 151 outputs timing signals R(n) for reading out signals from the first and second photoelectric conversion units 210a, 210b of the plurality of pixels 210 that are arranged in the column direction, in other words in the vertical direction in FIG. 5. To describe this in detail, the column scan circuit 151 outputs a timing signal R(1) to the first and second photoelectric conversion units 210a, 210b of the plurality of pixels 210 of the first column.

According to this timing signal R(1), first and second photoelectrically converted signals of the first and second photoelectric conversion units 210a, 210b of the plurality of pixels 210 in the first column are simultaneously read out by the first and second horizontal output circuits 152, 153 respectively. In this first embodiment, the first photoelectrically converted signals of the first photoelectric conversion units 210a are read out by the first horizontal output circuit 152, and the second photoelectrically converted signals of the second photoelectric conversion units 210b are read out by the second horizontal output circuit 153. The first horizontal output circuit 152 outputs the first photoelectrically converted signals of the first photoelectric conversion units 210a of the first column of pixels, which have thus been read out, sequentially from an output unit 152A, and, in a similar manner, the second horizontal output circuit 153 outputs the second photoelectrically converted signals of the second photoelectric conversion units 210b of the first column of pixels, which have thus been read out, sequentially from an output unit 153A.

Next, the column scan circuit 151 outputs a timing signal R(2) to the first and second photoelectric conversion units 210a, 210b of the plurality of pixels 210 of the second column. According to this timing signal R(2), the first and second photoelectrically converted signals of the first and second photoelectric conversion units 210a, 210b of the plurality of pixels 210 in the second column are simultaneously read out by the first and second horizontal output circuits 152, 153 respectively. And the first and second horizontal output circuits 152, 153 respectively output the first and second photoelectrically converted signals of the first and second photoelectric conversion units 210a, 210b of the second column of pixels, which have thus been read out, sequentially from the output units 152A, 153A.

In the following, in a similar manner, the column scan circuit 151 outputs timing signals R(n) to the first and second photoelectric conversion units 210a, 210b of the plurality of pixels 210 of the n-th column successively. And, according to these timing signals R(n), the first and second photoelectrically converted signals of the first and second photoelectric conversion units 210a, 210b of the plurality of pixels 210 in the n-th column are simultaneously read out by the first and second horizontal output circuits 152, 153 respectively, and are sequentially outputted from the output units 152A, 153A of the first and second horizontal output circuits 152, 153.

The first photoelectrically converted signals outputted from the first horizontal output circuit 152 and the second photoelectrically converted signals outputted from the second horizontal output circuit 153 are sent via the buffer memory 16 to the focus detection unit 12a and to the image generation unit 12b shown in FIG. 1, and the focus detection unit 12a performs phase difference focus detection calculation on the basis of the first and second photoelectrically converted signals of the first and second photoelectric conversion units 210a, 210b of the n-th column that have thus been simultaneously read out. Moreover, the image generation unit 12b adds together the photoelectrically converted signals of the first and second photoelectric conversion units 210a, 210b of each pixel 210, and thereby generates an image signal.

Figure 6:
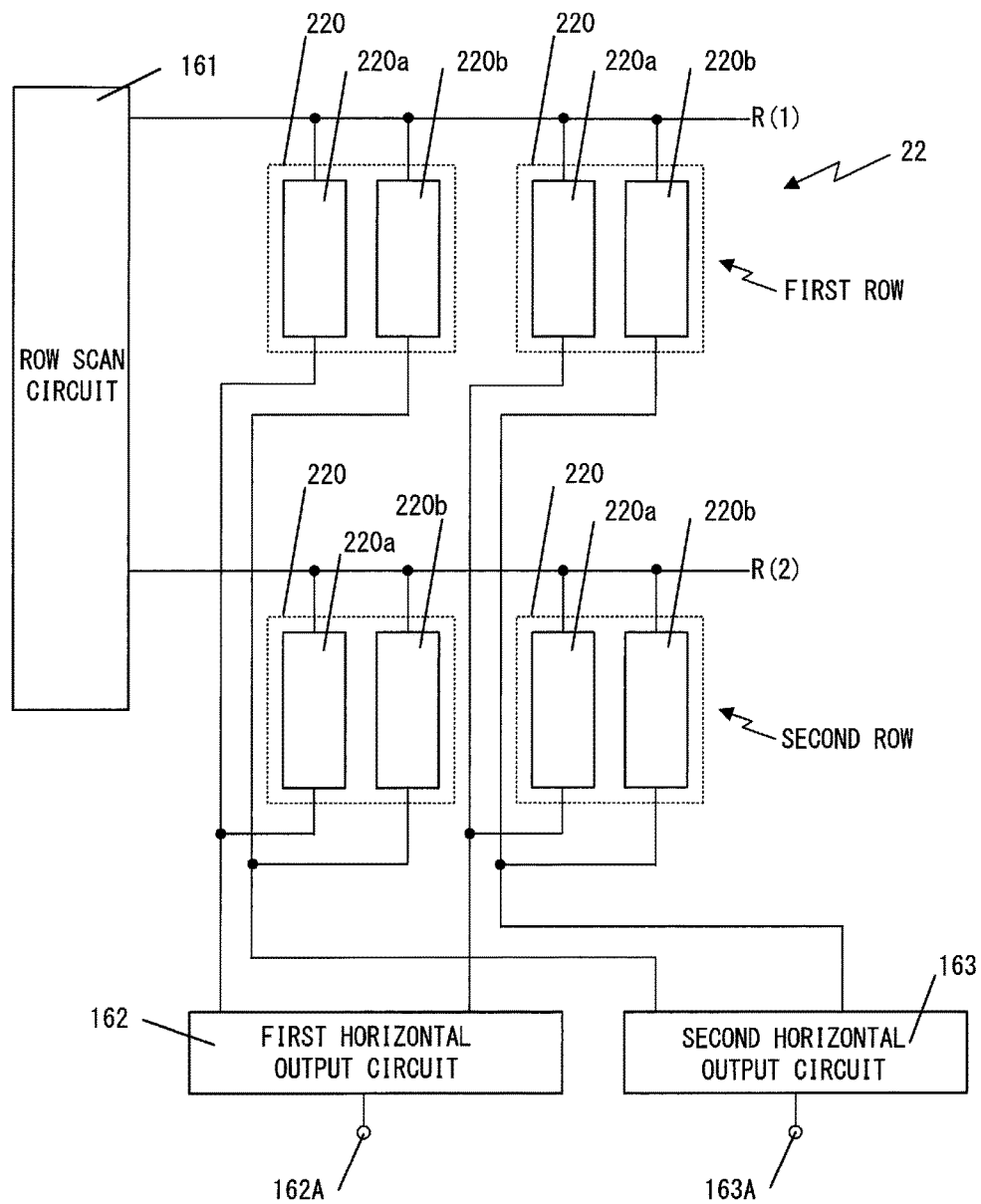
FIG. 6 is a figure showing a simplified readout circuit for the photoelectrically converted signals of the first and second photoelectric conversion units of the pixels of the second image sensor.

FIG. 6 is a figure showing a simplified readout circuit for the photoelectrically converted signals of the first and second photoelectric conversion units 220a and 220b of the pixels of the second image sensor 22. In FIG. 6, the second image sensor 22 comprises a row scan circuit 161 and first and second horizontal output circuits 162, 163. Since the signal readout circuits 161, 162, and 163 related to the photoelectrically converted signals of the first and second photoelectric conversion units 220a, 220b of the second image sensor 22 are similar to the signal readout circuits 151, 152, and 153 of the first image sensor 22 shown in FIG. 5, only the aspects in which they differ will be explained below.

The row scan circuit 161 outputs timing signals R(m) for reading out signals from the first and second photoelectric conversion units 220a, 220b of the pluralities of pixels 220 that are arranged in the row direction, i.e. in the horizontal direction in FIG. 6. In other words, the row scan circuit 161 outputs a timing signal R(1) for reading out signals from the first and second photoelectric conversion units 220a, 220b of the plurality of pixels 220 in the first row; then next outputs a timing signal R(2) for reading out signals from the first and second photoelectric conversion units 220a, 220b of the plurality of pixels 220 in the second row, and thereafter sequentially outputs timing signals R(m) for reading out signals from the first and second photoelectric conversion units 220a, 220b of the plurality of pixels 220 in the m-th row.

According to this timing signal R(m), the first horizontal output circuit 162 simultaneously reads out the first photoelectrically converted signals of the first photoelectric conversion units 220a of the plurality of pixels 220 in the m-th row, and, in a similar manner, the second horizontal output circuit 163 simultaneously reads out the second photoelectrically converted signals of the second photoelectric conversion units 220b of the plurality of pixels 220 in the m-th row.

The first horizontal output circuit 162 outputs the first photoelectrically converted signals of the first photoelectric conversion unit 220a, which have thus been read out, to the output unit 162A, and the second horizontal output circuit 163 outputs the second photoelectrically converted signals of the second photoelectric conversion unit 220b, which have thus been read out, to the output unit 163A.

The first photoelectrically converted signals outputted from the first horizontal output circuit 162 and the second photoelectrically converted signals outputted from the second horizontal output circuit 163 are sent via the buffer memory 16 to the focus detection unit 12a and to the image generation unit 12b shown in FIG. 1, and the focus detection unit 12a performs phase difference focus detection calculation on the basis of the first and second photoelectrically converted signals of the first and second photoelectric conversion units 220a, 220b of the m-th row that have been simultaneously read out. Moreover, the image generation unit 12b adds together the first and second photoelectrically converted signals of the first and second photoelectric conversion units 210a, 220b of each pixel 220, and thereby generates an image signal.

It should be understood that the signal readout circuit example of the first image sensor 21 shown in FIG. 5 and the signal readout circuit example of the second image sensor 22 shown in FIG. 6 are both formed upon the semiconductor substrate 50 of the second image sensor 22 shown in FIG. 4, and the pixels 210, 220 of the respective first and second image sensors 21, 22 are connected to the wiring layer 51.

Figure 7:
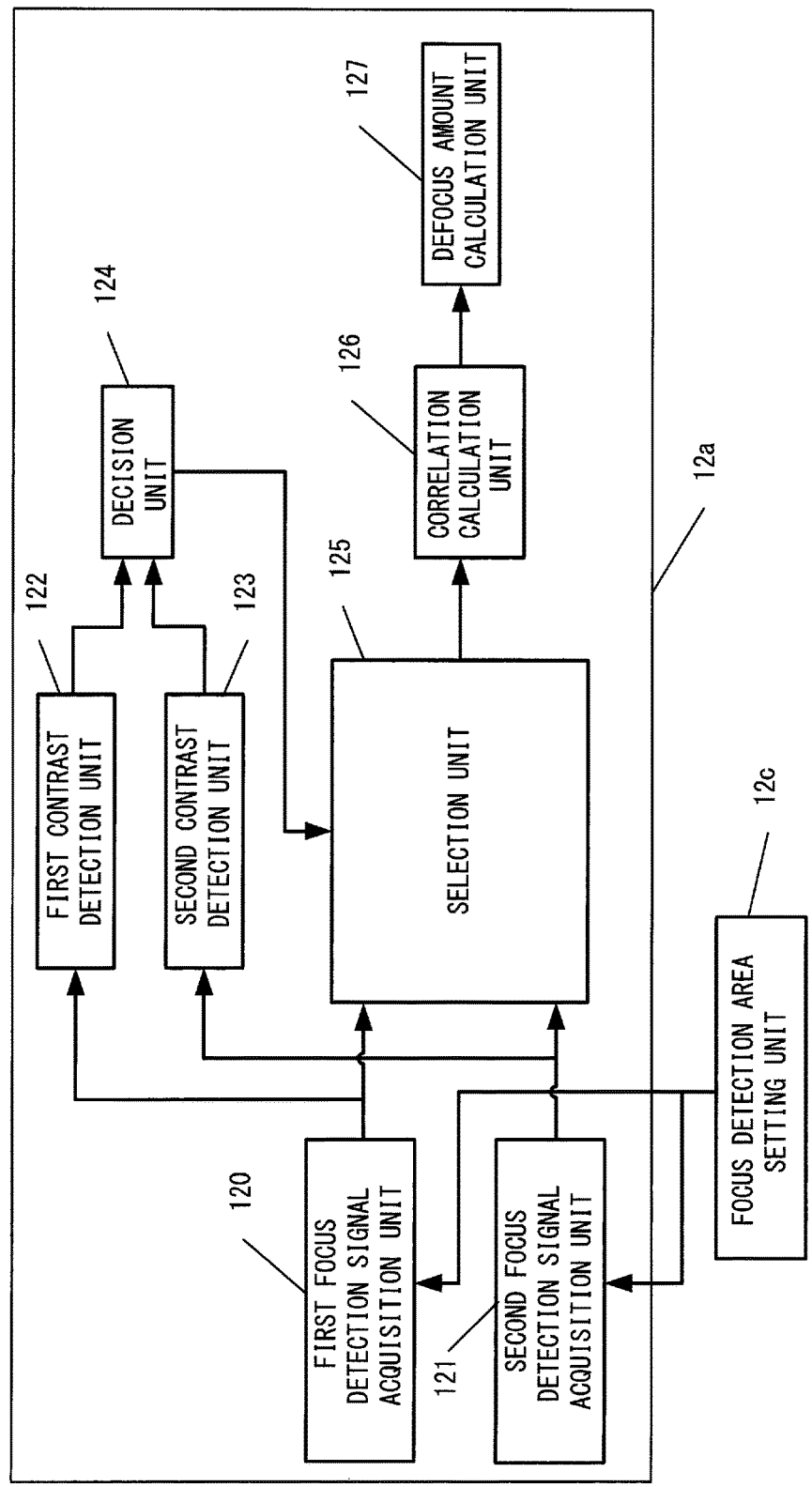
FIG. 7 is a block diagram showing in detail the functions fulfilled by a focus detection unit shown in FIG. 1.

FIG. 7 is a block diagram showing in detail the functions fulfilled by the focus detection unit 12a shown in FIG. 1. The focus detection unit 12a comprises first and second focus detection signal acquisition units 120 and 121, first and second contrast detection units 122 and 123, a decision unit 124, a selection unit 125, a correlation calculation unit 126, and a defocus amount calculation unit 127.

The focus detection area setting unit 12c outputs position information related to the set focus detection area that has been set as the focus detection subject region. For the first image sensor 21, the first focus detection signal acquisition unit 120 acquires, from among the first and second photoelectrically converted signals outputted from the first and second horizontal output circuits 152, 153 shown in FIG. 5, first and second photoelectrically converted signals from a plurality of pixels 210 that are arranged in the column direction in positions corresponding to the set focus detection area that has been set by the focus detection area setting unit 12c.

In a similar manner, for the second image sensor 22, the second focus detection signal acquisition unit 121 acquires, from among the first and second photoelectrically converted signals outputted from the first and second horizontal output circuits 162, 163 shown in FIG. 6, first and second photoelectrically converted signals from a plurality of pixels 220 that are arranged in the row direction in positions corresponding to the set focus detection area that has been set by the focus detection area setting unit 12c.

Due to the above, for the first image sensor 21, the first focus detection signal acquisition unit 120 acquires the first and second photoelectrically converted signals that were simultaneously read out from the plurality of pixels 210 arranged in the column direction and corresponding to the set focus detection area. These first and second photoelectrically converted signals related to the first image sensor 21 that have been acquired by the first focus detection signal acquisition unit 120 will be termed the "first focus detection signals". Moreover, for the second image sensor 22, the second focus detection signal acquisition unit 121 acquires the first and second photoelectrically converted signals that were simultaneously read out from the plurality of pixels 220 arranged in the row direction and corresponding to the set focus detection area. These first and second photoelectrically converted signals related to the second image sensor 22 that have been acquired by the second focus detection signal acquisition unit 121 will be termed the "second focus detection signals".

It should be understood that the first and second focus detection signals are each created from respective first and second photoelectrically converted signals of pixels that have the same spectral sensitivity. In concrete terms, the first focus detection signals related to the first image sensor 21 are selected from the first and second photoelectrically converted signals of the Mg pixels 210 that are arranged in the column direction in FIG. 3(a) as each second pixel. In a similar manner, the second focus detection signals related to the second image sensor 22 are selected from the first and second photoelectrically converted signals of the G pixels 220 that are arranged in the row direction in FIG. 3(b) as each second pixel. Of course, the first focus detection signals are not limited to being the first and second photoelectrically converted signals of the Mg pixels, and it would also be possible to employ the first and second photoelectrically converted signals of the Cy pixels or of the Ye pixels; and similarly the second focus detection signals are not limited to being the first and second photoelectrically converted signals of the G pixels, and it would also be possible to employ the first and second photoelectrically converted signals of the R pixels or of the B pixels.

The first contrast detection unit 122 calculates a first contrast amount of the image of the photographic subject in the set focus detection area on the basis of the first focus detection signals that have been acquired by the first focus detection signal acquisition unit 120. It should be understood that this contrast amount is calculated by integrating the difference between the first photoelectrically converted signals or the second photoelectrically converted signals (or between the totals of the first and the second photoelectrically converted signals) related to adjacent pixels that have been acquired by the first focus detection signal acquisition unit 120. It should be understood that this first contrast amount is the contrast amount of the image of the photographic subject that has been created upon the plurality of pixels 210 arranged in the column direction within the set focus detection area of the first image sensor 21.

And, in a similar manner to the case of the first contrast detection unit 122, the second contrast detection unit 123 calculates a second contrast amount of the image of the photographic subject in the set focus detection area on the basis of the second focus detection signals that have been acquired by the second focus detection signal acquisition unit 121. This second contrast amount is the contrast amount of the image of the photographic subject that has been created upon the plurality of pixels 220 arranged in the row direction within the set area of the second image sensor 22.

The decision unit 124 makes a decision as to whether or not at least one of the first and second contrast amounts is greater than or equal to a first threshold value. This first threshold value is determined so that the focus detection signals whose the contrast amount that is greater than or equal to the first threshold value can be employed in an effective manner. Accordingly, if both the first contrast amount and the second contrast amount are below the first threshold value, then the decision unit 124 decides that the image of the photographic subject in the set focus detection area is extremely blurred, in other words that it is in an extremely highly defocused state, and accordingly performs scanning driving of the focusing lens of the photographic lens 10.

But if at least one of the first and second contrast amounts is greater than or equal to the first threshold value, then the decision unit 124 makes a decision as to whether or not the difference between the first contrast amount and the second contrast amount is greater than or equal to a second threshold value. If the difference between the first contrast amount and the second contrast amount is greater than or equal to a second threshold value, then the decision unit 124 determines that, among the first and second contrast amounts, the focus detection signals whose contrast amount is the larger will be applied for phase difference focus detection, but that the focus detection signals whose contrast amount is the smaller will not be applied for phase difference focus detection. However, if the difference between the first contrast amount and the second contrast amount is smaller than the second threshold value, then the decision unit 124 determines that both the first and the second focus detection signals will be applied for phase difference focus detection.

On the basis of the output signal from the decision unit 124, the selection unit 125 selects either one or both of the first and second focus detection signals of the first and second focus detection signal acquisition units 120, 121, and sends the result to the correlation calculation unit 126. To explain this in detail, if the difference between the first contrast amount and the second contrast amount is greater than or equal to the second threshold value, then, when the first contrast amount is greater than the second contrast amount, the selection unit 125 selects the first focus detection signals of the first focus detection signal acquisition unit 120 and outputs them to the correlation calculation unit 126; and, when the second contrast amount is greater than the first contrast amount, the selection unit 125 selects the second focus detection signals of the second focus detection signal acquisition unit 121 and outputs them to the correlation calculation unit 126. Moreover, if the difference between the first contrast amount and the second contrast amount is less than the second threshold value, then the selection unit 125 selects both the first focus detection signals and the second focus detection signals of the first and second focus detection signal acquisition units 120, 121 and outputs them to the correlation calculation unit 126.

If the first focus detection signals are inputted from the selection unit 125, then the correlation calculation unit 126 performs correlation calculation on the basis of these first focus detection signals and calculates a first amount of image deviation, while, if the second focus detection signals are inputted from the selection unit 125, then the correlation calculation unit 126 performs correlation calculation on the basis of these second focus detection signals and calculates a second amount of image deviation; and, if both the first and the second focus detection signals are inputted from the selection unit 125, then the correlation calculation unit 126, along with performing correlation calculation on the basis of the first focus detection signals and calculating a first amount of image deviation, also performs correlation calculation on the basis of the second focus detection signals and calculates a second amount of image deviation.

The defocus amount calculation unit 127 calculates a defocus amount on the basis of the results of correlation calculation by the correlation calculation unit 126, in other words on the basis of the amount of image deviation. And focus adjustment of the photographic optical system is performed on the basis of this defocus amount. It should be understood that if, as described above, the selection unit 125 has selected both the first and second focus detection signals, then the defocus amount calculation unit 127 calculates the average value of a first defocus amount based upon the first focus detection signals and a second defocus amount based upon the second focus detection signals, and takes this average value as a final defocus amount. And focus adjustment of the photographic optical system is performed on the basis of this final defocus amount.

In this manner, the readout circuit is built so that the first and second photoelectrically converted signals are both read out simultaneously from a plurality of pixels 210 that are arranged in the column direction of the first image sensor 21, and so that the phase difference focus detection calculation is performed on the basis of these first and second photoelectrically converted signals that have both been read out simultaneously, in other words on the basis of the first focus detection signals. In a similar manner, the readout circuit is built so that the first and second photoelectrically converted signals are both read out simultaneously from a plurality of pixels 220 that are arranged in the row direction of the second image sensor 22, and so that the phase difference focus detection calculation is performed on the basis of these first and second photoelectrically converted signals that have both been read out simultaneously, in other words on the basis of the second focus detection signals. Since, due to this, the accuracy of calculation of the defocus amount becomes higher when the phase difference focus detection calculation is performed with the first focus detection signals that are read out simultaneously, or with the second focus detection signals that are read out simultaneously, accordingly it becomes possible to enhance the focus adjustment accuracy of the photographic optical system 10, and it becomes possible to enhance the image quality of the image that is obtained by image capture.

Figure 8:
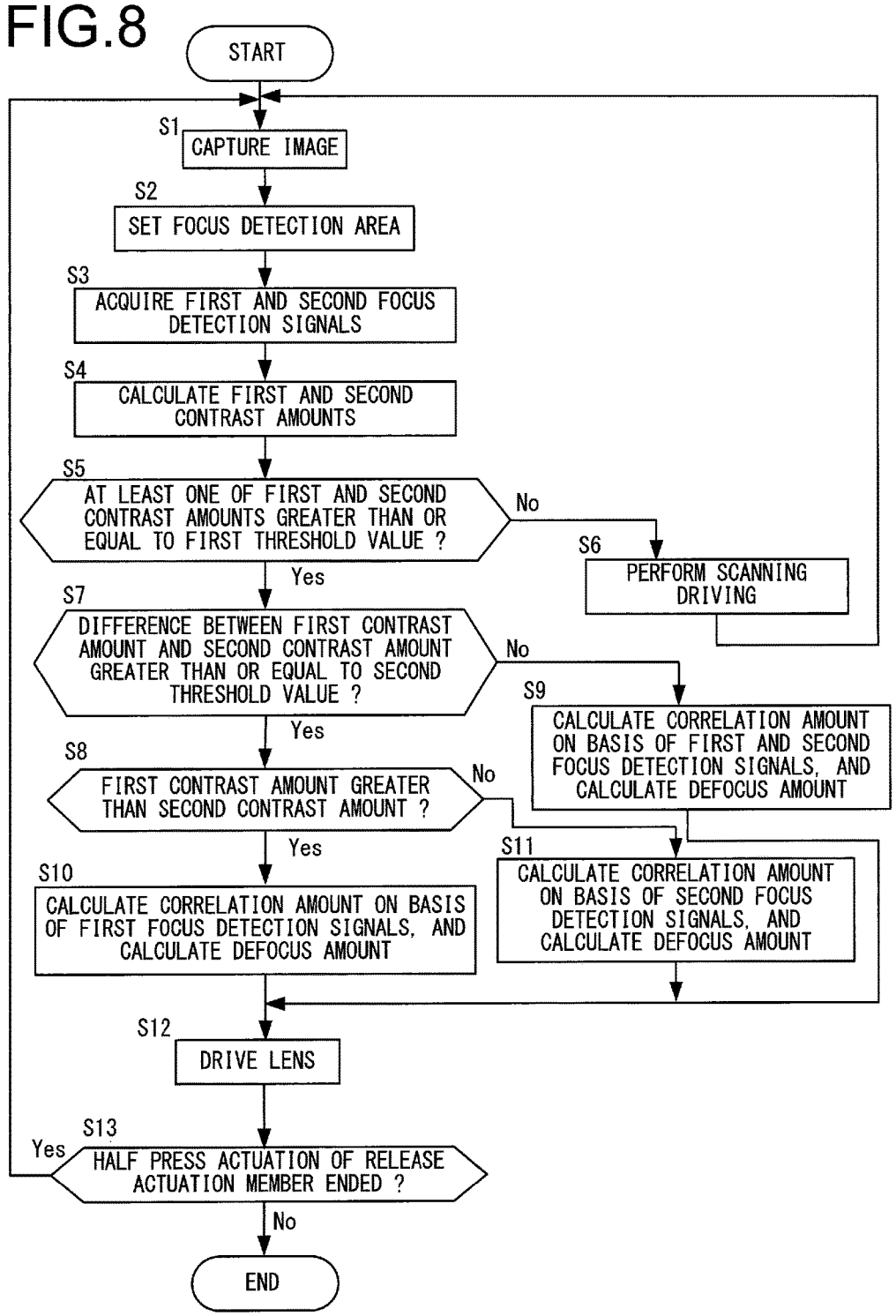
FIG. 8 is a flow chart showing first focus detection operation.

FIG. 8 is a flow chart showing this first focus detection operation. The focus detection processing shown in FIG. 8 is included in the control program executed by the control unit 12. The control unit 12 starts the focus detection processing shown in FIG. 8 when predetermined focus detection actuation is performed by the photographer, for example upon half press actuation of a release actuation member or the like.

Referring to FIGS. 7 and 8, in step S1 each of the first image sensor 21 and the second image sensor 22 captures an image of the photographic subject that has been formed by the photographic optical system 10. In the first image sensor 21, the first and second photoelectrically converted signals of the first and second photoelectric conversion units 210a, 210b of a plurality of pixels 210 that are arranged in the column direction are simultaneously read out. And, in the second image sensor 22, the first and second photoelectrically converted signals of the first and second photoelectric conversion units 220a, 220b of a plurality of pixels 220 that are arranged in the row direction are simultaneously read out. The first and second photoelectrically converted signals from the first image sensor 21 or from the second image sensor 22 are added together by the image generation unit 12b of FIG. 1 to produce a first or a second image signal, and this signal is image processed by the image processing unit 14 of FIG. 1 and is displayed upon the monitor 15 of FIG. 1 as a live view image. It should be understood that it will be acceptable for such a live view image to be displayed on the basis of the first image signal from the first image sensor 21, or to be displayed on the basis of the second image signal from the second image sensor 22.

In step S2, a set focus detection area within the photographic scene is set by the focus detection area setting unit 12c of FIG. 1. And then in step S3 the first focus detection signal acquisition unit 120 acquires, as the first focus detection signals, first and second photoelectrically converted signals of the first and second photoelectric conversion units 210a, 210b, among the first and second photoelectrically converted signals outputted from the first image sensor 21, of the plurality of pixels 210 that are arranged in the column direction and that correspond to the set focus detection area. And, in a similar manner the second focus detection signal acquisition unit 121 acquires, as the second focus detection signals, first and second photoelectrically converted signals of the first and second photoelectric conversion units 220a, 220b, among the first and second photoelectrically converted signals outputted from the second image sensor 22, for the plurality of pixels 220 that are arranged in the row direction and that correspond to the set focus detection area.

In step S4, the first contrast detection unit 122 calculates a first contrast amount of the image of the photographic subject in the set focus detection area on the basis of the first focus detection signals acquired by the first focus detection signal acquisition unit 120. As described above, this first contrast amount is the contrast amount in the column direction of the pixels 210 of the first image sensor 21. In a similar manner, the second contrast detection unit 123 calculates a second contrast amount of the image of the photographic subject in the set focus detection area on the basis of the second focus detection signals acquired by the second focus detection signal acquisition unit 121. As described above, this second contrast amount is the contrast amount in the column direction of the pixels 220 of the second image sensor 22.

Then in step S5 the decision unit 124 decides Whether or not at least one of the first contrast amount and the second contrast amount is greater than or equal to the first threshold value, and if a negative decision is reached then the flow of control proceeds to step S6, while if an affirmative decision is reached then the flow of control is transferred to step S7. In step S6, it is decided that the image of the photographic subject in the set focus detection area is extremely blurred, in other words is in an extremely highly defocused state, and the focusing lens of the photographic lens 10 is driven to perform scanning. On the other hand, in step S7 the decision unit 124 decides whether or not the difference between the first contrast amount and the second contrast amount is greater than or equal to the second threshold value, and if an affirmative decision is reached then the flow of control proceeds to step S8, while if a negative decision is reached then the flow of control is transferred to step S9. In step S8, a decision is made as to whether or not the first contrast amount is greater than the second contrast amount, and if an affirmative decision is reached then the flow of control is transferred to step S10, while if a negative decision is reached then the flow of control is transferred to step S11.

In step S10, since the first contrast amount is greater than the second contrast amount, in other words since the contrast amount in the column direction of the first image sensor 21 is greater than the contrast amount in the row direction of the second image sensor 22 in the set focus detection area, accordingly the selection unit 124 selects the first focus detection signals of the first focus detection signal acquisition unit 120, the correlation calculation unit 126 performs correlation calculation on the basis of these first focus detection signals, and the defocus amount calculation unit 127 calculates a defocus amount on the basis of the result of this correlation calculation. On the other hand, in step S11, since the second contrast amount is greater than the first contrast amount, in other words since the contrast amount in the row direction of the second image sensor 22 is greater than the contrast amount of the first image sensor 21 in the column direction in the set focus detection area, accordingly the selection unit 124 selects the second focus detection signals of the second focus detection signal acquisition unit 121, the correlation calculation unit 126 performs correlation calculation on the basis of these second focus detection signals, and the defocus amount calculation unit 127 calculates a defocus amount on the basis of the result of this correlation calculation.

Moreover, in step S9, since the difference between the first and second contrast amounts is less than the second threshold value, in other words since the first and second contrast amounts are almost equal to one another, accordingly the selection unit 125 selects both the first and the second focus detection signals of the first and second focus detection signal acquisition units 120 and 121, the correlation calculation unit 126 performs correlation calculation on the basis of the first focus detection signals and also performs correlation calculation on the basis of the second focus detection signals, and the defocus amount calculation unit 127 calculates a first defocus amount on the basis of the result of the correlation calculation according to the first focus detection signals, and also calculates a second defocus amount on the basis of the result of the correlation calculation according to the second focus detection signals, and then calculates a final defocus amount from the first and second defocus amounts.

In step S12, focus adjustment is performed by driving the focusing lens of the photographic optical system 10 on the basis of the defocus amount calculated in step S10, S11, or S9. And then in step S13 a decision is made as to whether or not half press actuation of the release actuation member has ended, and if an affirmative decision is reached then the focus detection operation is terminated, whereas if a negative decision is reached then the flow of control returns to step S1.

Since, as described above, in this first embodiment, the direction of arrangement of the first and second photoelectric conversion units 210a, 210b of the pixels 210 of the first image sensor 21 and the direction of arrangement of the first and second photoelectric conversion units 220a, 220b of the pixels 220 of the second image sensor 22 are different, accordingly the contrast of the image of the photographic subject that is formed upon the plurality of pixels 210 of the first image sensor 21 that are arranged in the column direction in the set focus detection area and the contrast of the image of the photographic subject that is formed upon the plurality of pixels 220 of the second image sensor 22 that are arranged in the row direction in the set focus detection area are compared together, so that it is possible to perform focus detection at high accuracy on the basis of the focus detection signal of that image sensor whose contrast is the higher.

In this first embodiment, according to the first and second contrast amounts, it is arranged to select either one or both of the first and the second focus detection signals, and for the correlation calculation unit 126 to perform correlation calculation on the basis of the selected focus detection signals. Instead of this, it would also be acceptable to arrange for the selection unit 125 always to select the first and the second focus detection signals, for the correlation calculation unit 126 to perform correlation calculation for both of the first and second focus detection signals, to select one or both of the result of correlation calculation according to the first focus detection signals and the result of correlation calculation according to the second focus detection signals on the basis of the quantity of the first and second contrast amounts, and to calculate a defocus amount on the basis of the result of the correlation calculation that has thus been selected.

Furthermore, it would also be acceptable to arrange for the defocus amount calculation unit 127 to calculate respective defocus amounts on the basis of all of the results of correlation calculation calculated by the correlation calculation unit 126, and, on the basis of the quantity of the first and second contrast amounts, to select an appropriate defocus amount from the plurality of defocus amounts that have been calculated in this manner.

With an image sensor in which pixels whose directions of subdivision of the first and second photoelectric conversion units are different are provided upon the photographic image surface, even if the same amounts of light are respectively incident upon two pixels whose directions of subdivision of the first and second photoelectric conversion units are different, due to the difference in the directions of subdivision of the first and second photoelectric conversion units, there is a danger that the outputs from each pixel of the first and second photoelectric conversion units may be different. Due to this, there is a danger of deterioration of the quality of the image that is obtained by image capture.

By contrast, in this first embodiment, it is arranged to generate image signals by adding together the photoelectrically converted signals of the first and second photoelectric conversion units 210*a*, 210*b* of the pixels 210 of the first image sensor 21 that have been subdivided in the column direction. And it is arranged also to generate image signals by adding together the photoelectrically converted signals of the first and second photoelectric conversion units 220*a*, 220*b* of the pixels 220 of the second image sensor 22 that have been subdivided in the row direction. Due to this, it is possible to obtain an image of high image quality with the first and second image sensors 21, 22.

Variant Embodiment #1

In this first embodiment, since there is a danger that it will not be possible to perform phase difference focus detection with good accuracy for a photographic subject image whose contrast is low, accordingly the contrast of the image of the photographic subject formed on a plurality of pixels 210 of the first image sensor 21 that are arranged in the column direction in the set focus detection area, and the contrast of the image of the photographic subject formed on a plurality of pixels 220 of the second image sensor 22 that are arranged in the row direction in the set focus detection area, are compared together, and focus adjustment is performed on the basis of the focus detection signals of that image sensor whose contrast is the higher. Photographic subject images for which it is not possible to perform phase difference focus detection with good accuracy not only are low contrast images as described above, but also are images containing patterns of brightness and darkness at a fixed cycle. Accordingly, variants of the above first embodiment will be explained below in which it is detected for which of the column direction and the row direction of the pixels of the first and second image sensors 21, 22 this type of fixed cycle pattern is present in the image, and focus detection is performed by employing the focus detection signals of that one of the image sensors in which such a cycle pattern is not present.

Figure 9:
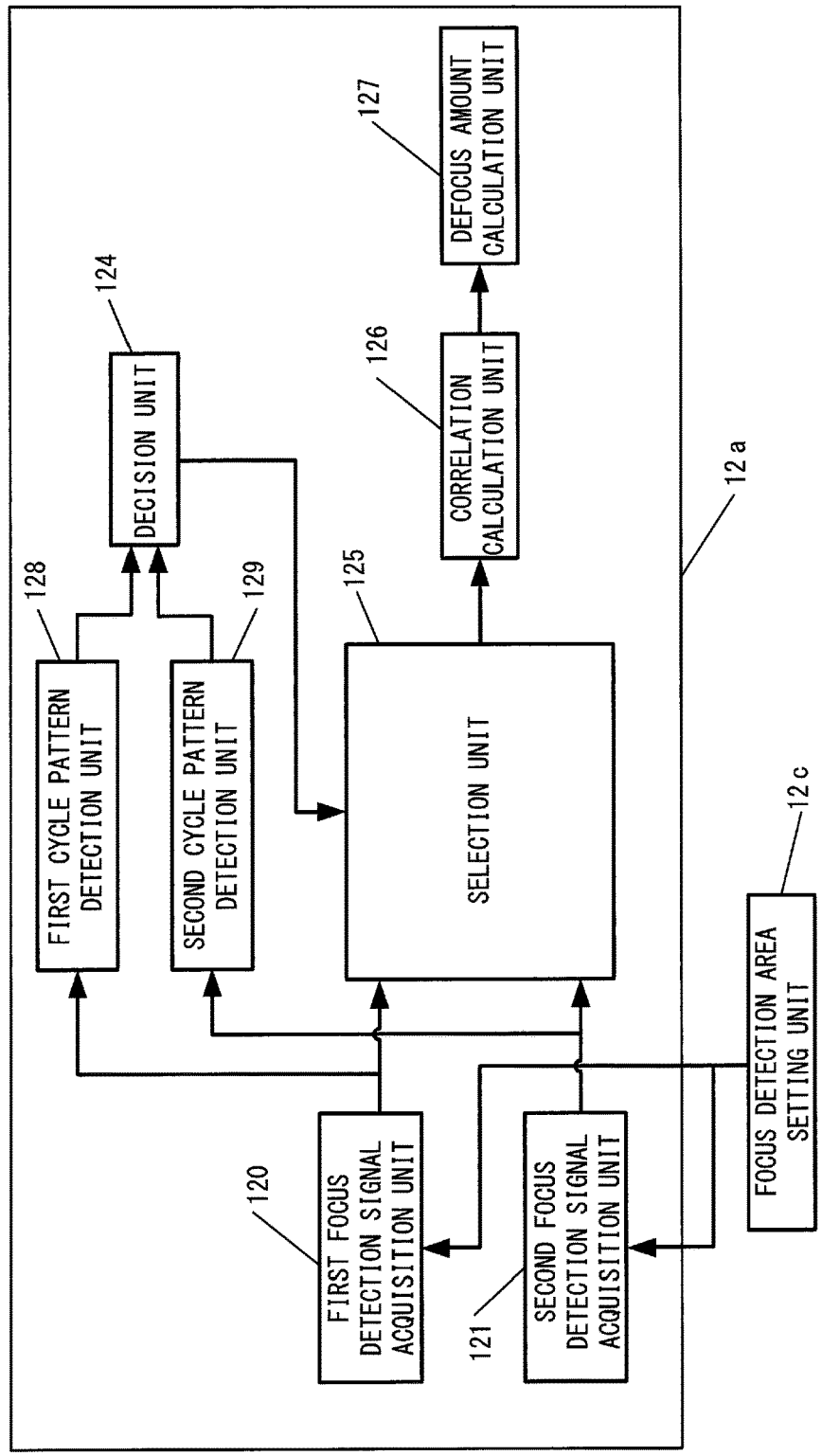
FIG. 9 is a block diagram showing a variant of the first embodiment.

FIG. 9 is a block diagram showing a variant of the first embodiment, in which the point of difference from the block diagram of the first embodiment shown in FIG. 7 is that first and second cycle pattern detection units 128, 129 are provided instead of the first and second contrast detection units 122, 123 of FIG. 7. The first cycle pattern detection unit 128 detects whether or not a cycle pattern is present in the first focus detection signals by detecting a cycle pattern signal waveform in the first focus detection signals from the first focus detection signal acquisition unit 120. In a similar manner, the second cycle pattern detection unit 129 detects whether or not a cycle pattern is present in the second focus detection signals by detecting a cycle pattern signal waveform in the second focus detection signals from the second focus detection signal acquisition unit 121. And the decision unit 124 makes a decision as to whether or not a cycle pattern has been detected by either of the first and second cycle pattern detection units 128, 129. If the decision unit 124 has decided that neither of the first and second cycle pattern detection units 128, 129 has detected any cycle pattern, then the selection unit 125 selects both of the first and second focus detection signals; while, if the decision unit 124 has decided that the first cycle pattern detection unit 128 has detected a cycle pattern, then the selection unit 125 selects the second focus detection signal; and, if the decision unit 124 has decided that the second cycle pattern detection unit 129 has detected a cycle pattern, then the selection unit 125 selects the first focus detection signal. The operation of the correlation calculation unit 126 and of the defocus amount calculation unit 127 is the same as in the case of FIG. 7.

As has been described above, in this variant embodiment, since the direction of arrangement of the first and second photoelectric conversion units 210*a*, 210*b* of the pixels 210 of the first image sensor 21 and the direction of arrangement of the first and second photoelectric conversion units 220*a*, 220*b* of the pixels 220 of the second image sensor 22 are different, accordingly it is possible to perform focus detection at high accuracy on the basis of the focus detection signal of that image sensor for which no cycle pattern exists, on the basis of the presence or absence of any cycle pattern in the image of the photographic subject formed upon the plurality of pixels 210 that are arranged in the column direction of the first image sensor 21 in the set focus direction area, and on the basis of the presence or absence of any cycle pattern in the image of the photographic subject formed upon the plurality of pixels 220 that are arranged in the row direction of the second image sensor 22 in the set focus direction area.

It should be understood that, in the variant embodiment shown in FIG. 9 as well, instead of the selection unit 125 selecting either or both of the first and second focus detection signals according to the presence or absence of cycle patterns, it would also be acceptable for the correlation calculation unit 126 always to perform correlation calculations on the basis of the first and second focus detection signals, and to select a correlation calculation result from those correlation calculation results that is determined according to the presence or absence of cycle patterns; or it would also be acceptable to arrange for the defocus amount calculation unit 127 always to calculate a defocus amount on the basis of the first and second focus detection signals, and to arrange to select a defocus amount from those defocus amounts that is determined according to the presence or absence of cycle patterns.

While, with the first embodiment or the first variant embodiment described above, the first focus detection signals from the first image sensor 21 and/or the second focus detection signals from the second image sensor 22 were selected upon the basis of the quantity of the contrast amounts or upon the basis of the presence or absence of cycle patterns therein, instead of the above, it would also be possible to detect the attitude of the digital camera 1 with an attitude sensor or the like, and to select the second focus detection signals from the second image sensor 22, in other words to perform focus adjustment using the second focus detection signals when the digital camera 1 is in its normal horizontal position, in other words when the row direction of the pixel arrangement of the second image sensor 22 of FIG. 3 and the horizontal direction coincide, while on the other hand, to select the first focus detection signals from the first image sensor 21, in other words to perform focus adjustment using the first focus detection signals when the digital camera 1 is in its vertical position, in other words when the column direction of the pixel arrangement of the first image sensor 21 of FIG. 3 and the horizontal direction coincide.

Variant Embodiment #2

Figure 10:
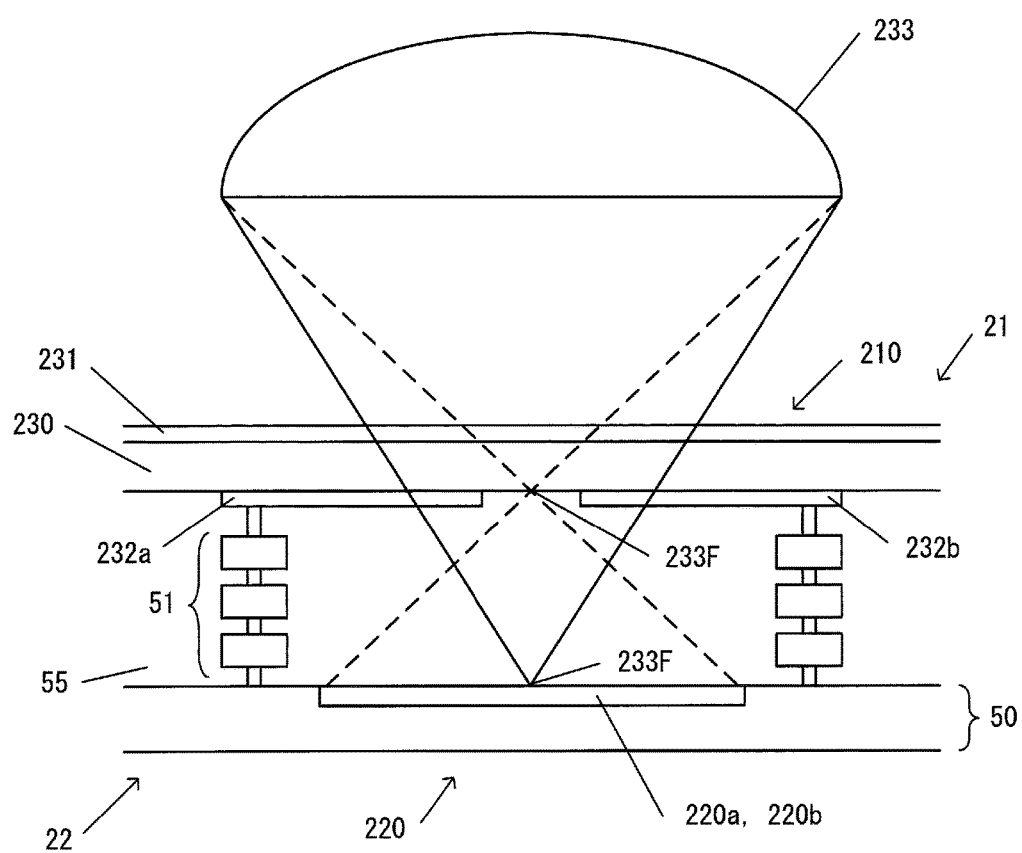
FIG. 10 is a sectional view showing a variant embodiment of the structures of the first and second image sensors.

FIG. 10 shows a second variant of the first embodiment. In this second variant embodiment, the focal point 233F of the micro lens 233 is positioned upon the first and second photoelectric conversion units 220a, 220b of the second image sensor 22 as shown by the solid lines in FIG. 10; or alternatively, the focal point 233F of the micro lens 233 may be positioned upon the first and second photoelectric conversion units 210a, 210b of the first image sensor 21 as shown by the broken lines.

Variant Embodiment #3

Figure 11:
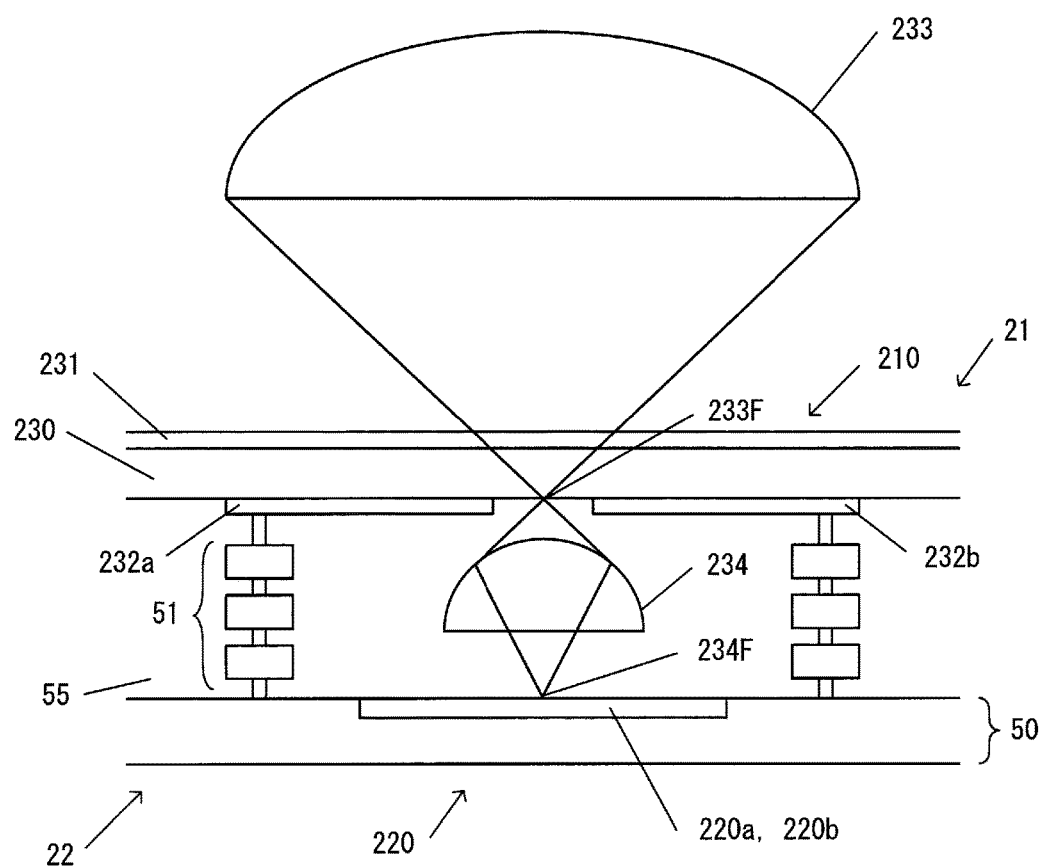
FIG. 11 is a sectional view showing another variant embodiment of the structures of the first and second image sensors.

FIG. 11 shows a third variant of the first embodiment. In FIG. 11, the focal point 233F of the micro lens 233, in other words its focal plane, is located at the position of the first and second photoelectric conversion units 210a, 210b of the first image sensor 21. And an inner lens 234 is disposed between the first image sensor 21 and the second image sensor 22. The refracting power and the position of arrangement of this inner lens 234 are determined so that the position of the first and second photoelectric conversion units 210a, 210b of the first image sensor 21 and the position of the first and second photoelectric conversion units 220a, 220b of the second image sensor 22 become optically conjugate with respect to this inner lens 234.

Due to the provision of this inner lens 234 in this configuration, the position conjugate to the position of the first and second photoelectric conversion units 220a, 220b of the second image sensor 22 with respect to the micro lens 233 and the inner lens 234, and the position conjugate to the position of the first and second photoelectric conversion units 210a, 210b of the first image sensor 21 with respect to the micro lens 233, coincide with one another. To put this in another manner, due to this provision and arrangement of the inner lens 234, the position of the first focus detection pupil plane relating to the first image sensor 21 and the position of the second focus detection pupil plane with respect to the second image sensor 22 can be made to coincide with one another.

Variant Embodiment #4

Figure 12:
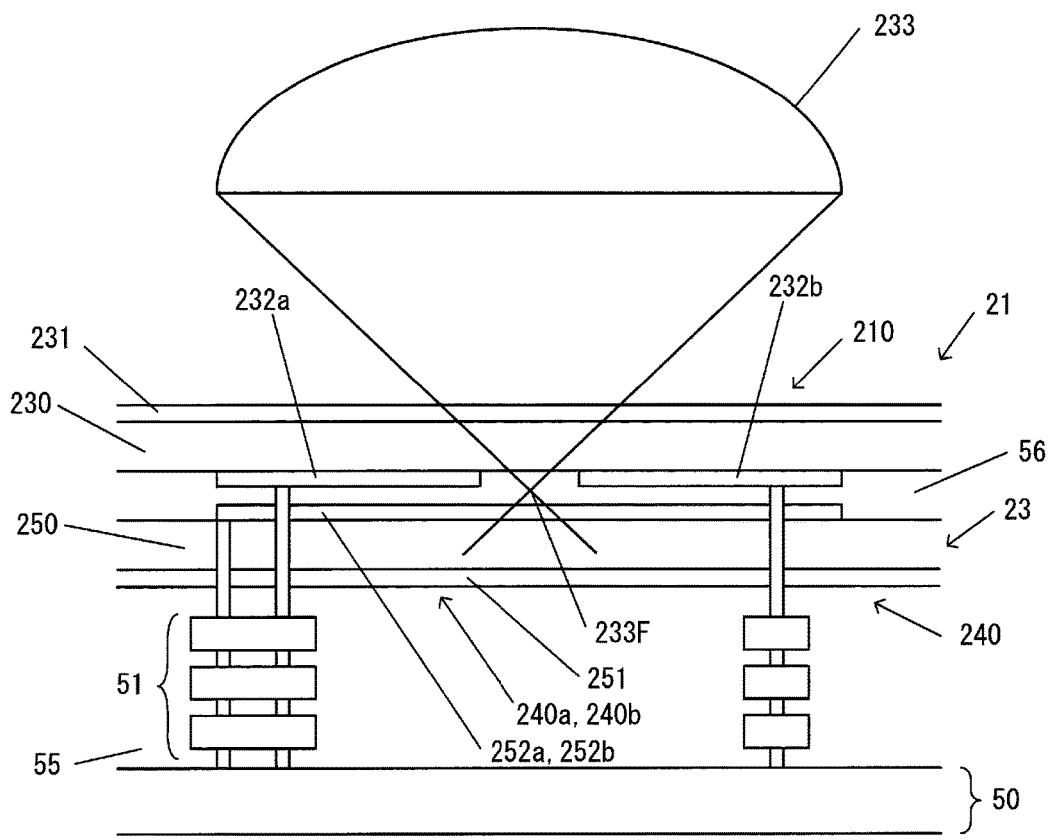
FIG. 12 is a sectional view showing yet another variant embodiment of the structures of the first and second image sensors.

FIG. 12 is a sectional view showing a fourth variant of the first embodiment. In the first embodiment, as shown in FIG. 4, the first image sensor 21 employed organic photoelectric sheets as photoelectric conversion units, and the second image sensor 22 employed photo-diodes as photoelectric conversion units. However, in this fourth variant embodiment, both the first and the second image sensors 21, 22 employ organic photoelectric sheets as photoelectric conversion units.

In FIG. 12, the structure of the first image sensor 21 is the same as that of the first image sensor 21 shown in FIG. 4. However, the second image sensor 23 is formed upon the upper surface of a semiconductor substrate 50 with a flattening layer 55 interposed between them, and each of its pixels 240 comprises first and second photoelectric conversion units 240a, 240b that are arranged in the direction perpendicular to the surface of the drawing paper.

Each of the pixels 240 of the second image sensor 23 comprises an organic photoelectric sheet 250, a transparent common electrode 251 that is formed upon the lower surface of the organic photoelectric sheet 250, and transparent first and second partial electrodes 252a, 252b that are formed upon the upper surface of the organic photoelectric sheet 250. As described above, these first and second partial electrodes 252a, 252b are arranged in the direction perpendicular to the surface of the drawing paper, in other words in the direction that is orthogonal to the direction in which the first and second partial electrodes 232a, 232b of the first image sensor 21 are arranged. In each of the pixels 240 of the second image sensor 23, a first photoelectric conversion unit 240a includes the organic photoelectric sheet 250, the common electrode 251, and the first partial electrode 252a, and a second photoelectric conversion unit 240b includes the organic photoelectric sheet 250, the common electrode 251, and the second partial electrode 252b.

An insulating layer 56 is provided between the first image sensor 21 and the second image sensor 23. And a signal readout circuit for the first image sensor 22 and a signal readout circuit for the second image sensor 23 are formed upon the semiconductor substrate 50. A wiring layer 51 that may have, for example, a three-layered structure is provided between the semiconductor substrate 50 and the second image sensor 23.

Since, as described above, according to this fourth variant embodiment, the wiring layer 51 is provided in the gap between the second image sensor 23 and the semiconductor substrate 50, accordingly a comparatively large gap is required, on the other hand the gap between the first and second image sensors 21, 23 can be made comparatively small, since no wiring layer 51 is required there. Accordingly, it is possible to bring the position of the focus detection pupil plane related to the first image sensor 21 and the position of the focus detection pupil plane related to the second image sensor 23 close to one another.

Figure 13:
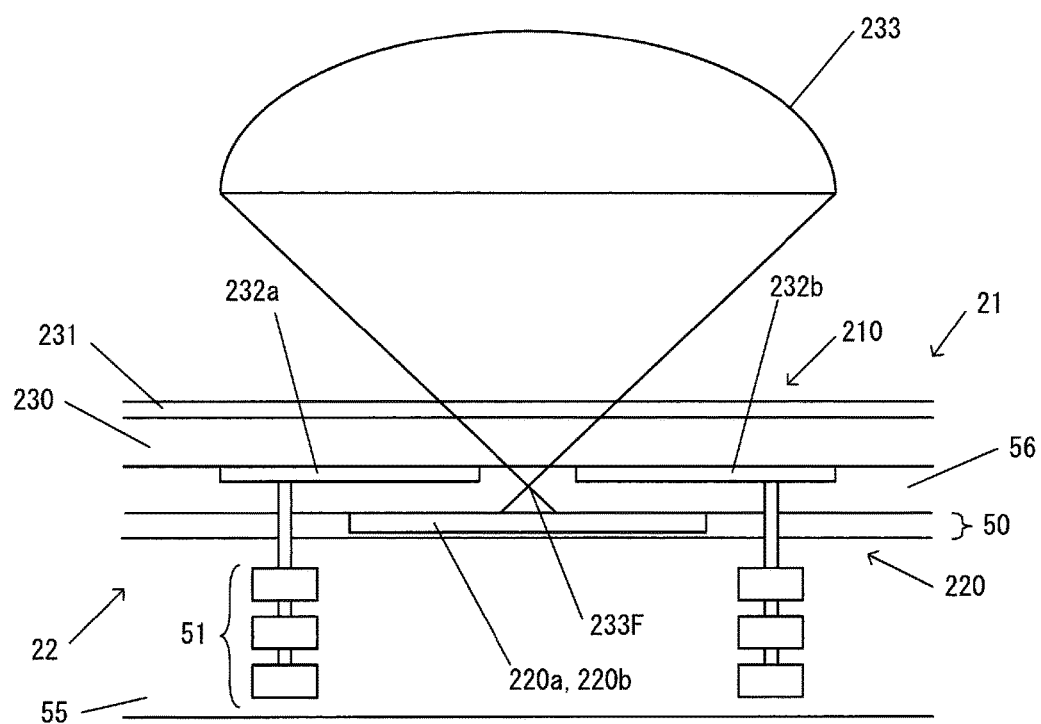
FIG. 13 is a sectional view showing still another variant embodiment of the structures of the first and second image sensors.

Moreover, it would also be acceptable to arrange for the second image sensor 22 to be an image sensor of the backside-illumination type, as shown in FIG. 13. Since, in a similar manner to the case described above, the provision of any wiring layer 51 is not required, accordingly the gap between the first and second image sensors 21, 22 can be made comparatively small. Therefore, it is possible to bring the position of the focus detection pupil plane related to the first image sensor 21 and the position of the focus detection pupil plane related to the second image sensor 22 close to one another.

Variant Embodiment #5

Figure 14:
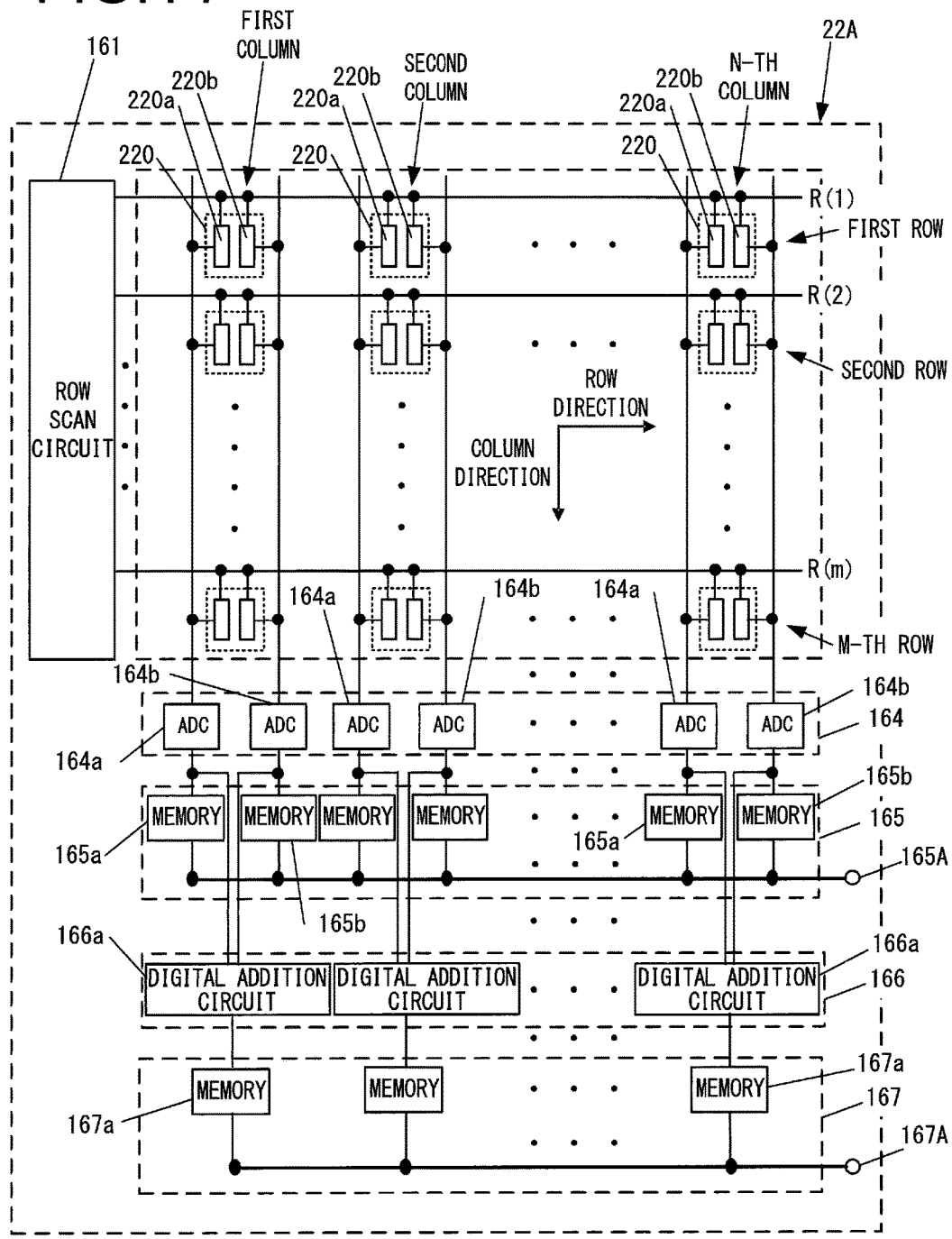
FIG. 14 is a block diagram showing a variant of the first embodiment.

FIG. 14 is a block diagram showing a fifth variant of the first embodiment. In the signal readout circuitry for the first and second image sensors 21, 22 shown in FIGS. 5 and 6, the first photoelectrically converted signal was outputted from the first horizontal output circuits 152, 162 and the second photoelectrically converted signal was outputted from the second horizontal output circuits 153, 163, and moreover the A/D conversion circuit 24 performs A/D conversion on the first and second photoelectrically converted signals from the first and second image sensors 21, 22, and the image generation unit 12b of the control unit 12 performs addition of the first and second photoelectrically converted signals. However, this fifth variant embodiment includes an AO conversion unit that performs A/D conversion on the first and second photoelectrically converted signals of the pixels 220 of the second image sensor 22, a horizontal output circuit for the first and second photoelectrically converted signals that outputs both the first and second photoelectrically converted signals, an addition circuit that adds together the first and second photoelectrically converted signals, and a horizontal output circuit for the added signals that outputs the added signals.

In FIG. 14, the second image sensor 22 comprises a row scan circuit 161, an A/D conversion unit 164, a horizontal output circuit 165 for the first and second photoelectrically converted signals, an addition unit 166, and a horizontal output circuit 167 for the added signals. In the following explanation, principally the difference from the readout circuitry for the photoelectrically converted signals of the second image sensor 22 shown in FIG. 6 will be explained.

The A/D conversion unit 164 comprises n ADCs (analog to digital conversion circuits) 164a that respectively correspond to the first photoelectric conversion units 220a of n columns of pixels arranged in the row direction, and n ADCs 164b that respectively correspond to the second photoelectric conversion units 220b of these pixels 220.

The horizontal output circuit 165 for the first and second photoelectrically converted signals comprises n memories 165a that respectively correspond to the n ADCs 164a of the A/D conversion unit 164, and n memories 165b that respectively correspond to the n ADCs 164b of the A/D conversion unit 164.

The addition unit 166 comprises n digital addition circuits 165a that respectively correspond to the pixels 220 that are arranged in n columns in the row direction.

The horizontal output circuit 167 for the added signals comprises n memories 167a that respectively correspond to the n digital addition circuits 166a of the addition unit 166.

According to the timing signal R(1), the photoelectrically converted signals of the first and second photoelectric conversion units 220a, 220b of the n pixels 220 of the first row are simultaneously outputted to the respectively corresponding ADCs 164a, 164b of the A/D conversion unit 164. The ADCs 164a, 164b convert the photoelectrically converted signals of the first and second photoelectric conversion units 220a, 220b that have thus been inputted into respective digital signals, which are then respectively outputted to the corresponding memories 165a, 165b of the horizontal output circuit 165 for the first and second photoelectrically converted signals. And each of the memories 165a, 165b of the horizontal output circuit 165 for the first and second photoelectrically converted signals stores the respective digital signal outputted from the ADCs 164a, 164b. Then the first and second photoelectrically converted signals thus stored in the memories 165a, 165b of the horizontal output circuit 165 for the first and second photoelectrically converted signals are sequentially outputted from the output unit 165a.

Moreover, the digital addition circuits 166a of the addition unit 166 add together the first and second photoelectrically converted signals that have respectively been A/D converted by the ADCs 164a, 164b of each of the pixels 220. And the memories 167a of the horizontal output circuit 167 for the added signals respectively store the added digital signals outputted from the digital addition circuits 166a. Then the added digital signals that have been stored in the memories 167a of the horizontal output circuit 167 for the added signals are outputted sequentially from the output unit 167A.

And next, according to the timing signal R(2), the first and second photoelectrically converted signals of the first and second photoelectric conversion units 220a, 220b of the plurality of pixels 220 of the second row are converted into respective digital signals by the A/D conversion unit 164, and are sequentially outputted from the output unit 165A of the horizontal output circuit 165 for the first and second photoelectrically converted signals. Moreover, the first and second photoelectrically converted signals that have been A/D converted by the A/D conversion unit 164 are added together by the digital addition circuits 166a, and the added signals are outputted sequentially from the output units 167A of the horizontal output circuit 167 for the added signals.

Subsequently, sequentially according to the timing signal R(m), the first and second photoelectrically converted signals of the first and second photoelectric conversion units 220a, 220b of the plurality of pixels 220 of the m-th row are converted into respective digital signals by the A/D conversion unit 164 and are sequentially outputted from the output unit 165A of the horizontal output circuit 165 for the first and second photoelectrically converted signals, and the added signals are sequentially outputted from the output unit 167A of the horizontal output circuit 167 for the added signals.

Thus it is seen that it will be acceptable for the photoelectrically converted signals of the first and second photoelectric conversion units 210a, 210b of the pixels 210 of the first image sensor 21 and the photoelectrically converted signals of the first and second photoelectric conversion units 220a, 220b of the pixels 220 of the second image sensor 22 to be added together outside the image sensors 21, 22, in other words to be added together by the image generation unit 126 of FIG. 1; or, alternatively, it will be acceptable for those signals to be added together in the interiors of the image sensors 21, 22, as shown in FIG. 14.

Variant Embodiment #6

In the first embodiment, the first and second photoelectric conversion units 210a and 210b of the pixels 210 of the first image sensor 21 are arranged in the column direction as shown in FIG. 3, in other words in the vertical direction in FIG. 3(*a*), while the first and second photoelectric conversion units 220a and 220b of the pixels 220 of the second image sensor 22 are arranged in the row direction as shown in FIG. 3, in other words in the left and right direction in FIG. 3(*b*). However, it would also be acceptable to provide a structure in which the first and second photoelectric conversion units 210a and 210b of the pixels 210 of the first image sensor 21 are arranged in the row direction, while the first and second photoelectric conversion units 220a and 220b of the pixels 220 of the second image sensor 22 are arranged in the column direction.

Variant Embodiment #7

In the first embodiment, along with the first and second photoelectrically converted signals from the first and second image sensors 21, 22 being employed as focus detection signals, the same signals are also employed as image signals. However, for example, it would also be acceptable to arrange to employ the first and second photoelectrically converted signals from one of the first and second image sensors 21, 22 as image signals, while employing the first and second photoelectrically converted signals from the other of the first and second image sensors 21, 22 as focus detection signals.

Variant Embodiment #8

Figure 15:
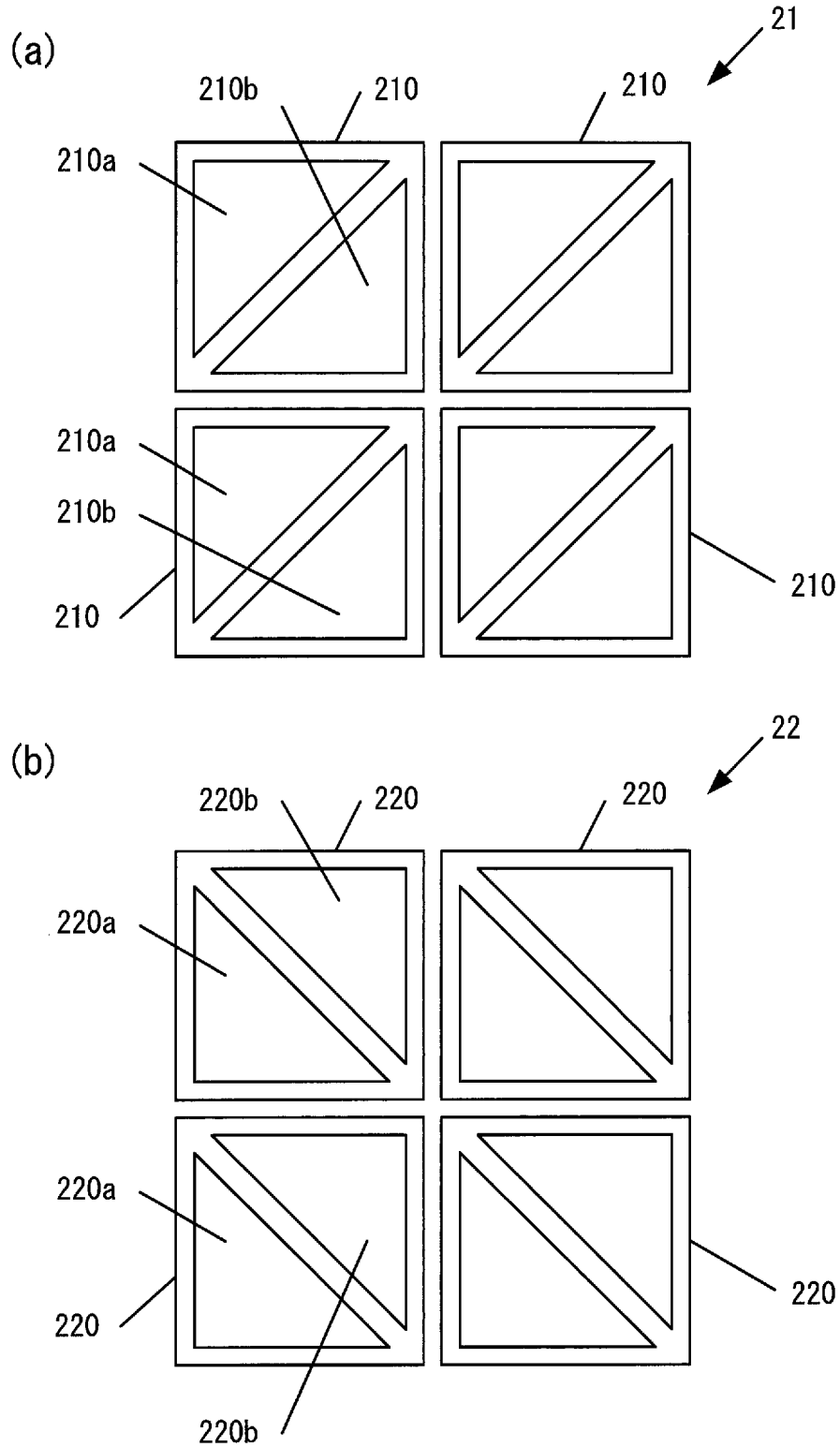
FIG. 15(a) is a figure showing a variant embodiment of the pixels of the first image sensor.
FIG. 15(b) is a figure showing a variant embodiment of the pixels of the second image sensor.

FIG. 15 is a figure showing an eighth variant of the first embodiment. In the first embodiment, as shown in FIG. 3, the shapes of the first and second photoelectric conversion units 210a, 210b of the pixels 210 of the first image sensor 21 are obtained by dividing the large square pixel shapes equally along the horizontal directions thereof, while the shapes of the first and second photoelectric conversion units 220a, 220b of the pixels 220 of the second image sensor 22 are obtained by dividing the large square pixel shapes equally along the vertical directions thereof. However, in this eighth variant embodiment, the shapes of the first and second photoelectric conversion units of the first and second image sensor 21, 22 are obtained by dividing the large square pixel shapes equally along the direction of diagonals thereof. FIG. 15(a) shows two rows by two columns of pixels 210 of the first image sensor 21, in which the first and second photoelectric conversion units 210a, 210b are formed as right angled triangles by dividing the large square pixel shapes along diagonals thereof. And FIG. 15(b) shows two rows by two columns of pixels 220 of the second image sensor 22, in which the first and second photoelectric conversion units 220a, 220b are formed as right angled triangles by dividing the large square pixel shapes along diagonals thereof, in a similar manner to the case with the first image sensor 21, but with the diagonal direction of this division being orthogonal to the direction of diagonal division of the first image sensor 21.

Accordingly, the direction along which the first and second photoelectric conversion units 210a, 210b of the pixels 210 of the first image sensor 21 are arranged, in other words their direction of arrangement, is different from the direction along which the first and second photoelectric conversion units 220a, 220b of the pixels 220 of the second image sensor 22 are arranged, in other words from their direction of arrangement.

Variant Embodiment #9

FIG. 16 is a figure showing a ninth variant of the first embodiment. In the first embodiment, as shown in FIG. 3, each of the pixels 210 of the first image sensor 21 and each of the pixels 220 of the second image sensor 22 includes first and second photoelectric conversion units. However, in this ninth variant embodiment, each of the pixels of the first and second image sensors includes first through fourth photoelectric conversion units. In other words, in this ninth variant embodiment, the photoelectric conversion units of each of the pixels are divided into four parts. In FIG. 16(a), the pixels 210, 220 of the first and second image sensors 21, 22 have respective sets of first through fourth photoelectric conversion units 210c through 210F and 220c through 220f, each pixel being divided along the row direction and along the column direction.

Accordingly if, along with first focus detection signals for the pixels 210 of the first image sensor 21 being generated, for example, from the photoelectrically converted signals of the first photoelectric conversion units 210c and from the photoelectrically converted signals of the second photoelectric conversion units 210d, also second focus detection signals for the pixels 220 of the second image sensor 22 are generated, for example, from the photoelectrically converted signals of the first photoelectric conversion units 220c and from the photoelectrically converted signals of the third photoelectric conversion units 220e, then the direction in which the first and second photoelectric conversion units 210c, 210d of the pixels 210 of the first image sensor 21 are arranged, in other words their direction of arrangement, and the direction in which the first and second photoelectric conversion units 220c, 220e of the pixels 220 of the second image sensor 22 are arranged, in other words their direction of arrangement, are different.

Moreover, in FIG. 16(b), the pixels 210, 220 of the first and second image sensors 21, 22 have respective sets of first through fourth photoelectric conversion units 210e through 210f and 220c through 220f, each pixel being divided along a diagonal direction. Accordingly if, along with first focus detection signals for the pixels 210 of the first image sensor 21 being generated, for example, from the photoelectrically converted signals of the first photoelectric conversion units 210c and the photoelectrically converted signals of the fourth photoelectric conversion units 210f, also second focus detection signals for the pixels 220 of the second image sensor 22 are generated, for example, from the photoelectrically converted signals of the second photoelectric conversion units 220d and the photoelectrically converted signals of the third photoelectric conversion units 220e, then the direction in which the first and fourth photoelectric conversion units 210c, 210f of the pixels 210 of the first image sensor 21 are arranged, in other words their direction of arrangement, and the direction in which the second and third photoelectric conversion units 220d, 220e of the pixels 220 of the second image sensor 22 are arranged, in other words their direction of arrangement, are different.

Variant Embodiment #10

In a tenth variant embodiment, an image sensor that employs an organic photoelectric sheet is built with a two-layered structure.

Due to the "Mg" pixels, the "Cy" pixels, and the "Ye" pixels, the first image sensor absorbs for example 50% of the magenta color component, for example 50% of the cyan color component, and for example 50% of the yellow color component, and passes the remaining portion of the magenta color component, the remaining portion of the cyan color component, and the remaining portion of the yellow color component, and also passes the green color component, the red color component, and the blue color component.

In a similar manner to the case with the first image sensor 21, a third image sensor is an image sensor in which organic photoelectric sheets are used as photoelectric conversion units. This third image sensor is arranged by being laminated to the rear of the first image sensor, and, in a similar manner to the case with the first image sensor, has "Mg" pixels, "Cy" pixels, and "Ye" pixels, and these "Mg" pixels, "Cy" pixels, and "Ye" pixels, along with absorbing the remaining portion of the magenta color component, the remaining portion of the cyan color component, and the remaining portion of the yellow color component that have been passed through the first image sensor, also passes the green color component, the red color component, and the blue color component that have been passed by the first image sensor.

The second image sensor is exactly the same as the second image sensor shown in FIGS. 3 and 4, and absorbs and photoelectrically converts the green color component, the blue color component, and the red color component that have passed through the third image sensor.

Accordingly when, for example, the photoelectric conversion units shown in FIG. 15(a) or 15(b) are employed as the first and second photoelectric conversion units of the pixels of the third image sensor, then each of the first through third image sensors has a different direction in which its first and second photoelectric conversion units are arranged in sequence.

Furthermore, it would also be acceptable to provide a fourth image sensor that employs organic photoelectric sheets and that has "R", "G", and "B" pixels between the third image sensor and the second image sensor. The "R" pixels, the "G" pixels, and the "B" pixels of this fourth image sensor may absorb for example 50% of the red color component, for example 50% of the green color component, and for example 50% of the blue color component that have passed through the third image sensor, while passing the remainders thereof. In this way, the first and third image sensors that have "Mg" pixels, "Cy" pixels, and "Ye" pixels and the second and fourth image sensors that have "R" pixels, "G" pixels, and "B" pixels are mutually laminated together. By employing a structure such as that of FIG. 3, FIG. 15, FIG. 16 or the like as the structure of the photoelectric conversion units of these first through fourth image sensors, it is possible to make the directions in which the photoelectric conversion units are arranged in sequence be different for each of the image sensors.

Variant Embodiment #11

In the first embodiment the first and second photoelectrically converted signals of the first and second photoelectric conversion units 210a, 210b of a plurality of pixels 210 in the n-th column of the first image sensor 21 are read out simultaneously to the first and second horizontal output circuits 152, 153 respectively, and are outputted sequentially from the output units 152A, 153A of the first and second horizontal output circuits 152, 153. However, in an eleventh variant embodiment, the readout circuit for the photoelectrically converted signals of the first and second photoelectric conversion units 210a and 210b of the pixels 210 of the first image sensor 21 has the structure shown in FIG. 6, in other words has the same structure as the readout circuit for the second image sensor 22.

The row scan circuit 161 outputs a timing signal R(m) for signal readout to the first and second photoelectric conversion units 210a, 210b of the pluralities of pixels 210. In other words, the row scan circuit 161 outputs a timing signal R(1) for signal readout to the first and second photoelectric conversion units 210a, 210b of the plurality of pixels 210 in the first row, and next outputs a timing signal R(2) for signal readout to the first and second photoelectric conversion units 210a, 210b of the plurality of pixels 210 in the second row, and thereafter sequentially outputs a timing signal R(m) for signal readout to the first and second photoelectric conversion units 210a, 210b of the plurality of pixels 210 in the m-th row.

In response to the timing signal R(m), the first horizontal output circuit 162 simultaneously reads out the first photoelectrically converted signals of the first photoelectric conversion units 210a of the plurality of pixels 210 in the m-th row, and in a similar manner the second horizontal output circuit 163 simultaneously reads out the second photoelectrically converted signals of the second photoelectric conversion units 210b of the plurality of pixels 210 in the m-th row.

The first horizontal output circuit 162 outputs from the output unit 162A the first photoelectrically converted signals of the first photoelectric conversion units 210a that have thus been read out, and the second horizontal output circuit 163 outputs from the output unit 163A the second photoelectrically converted signals of the second photoelectric conversion units 210b that have thus been read out.

The first photoelectrically converted signals that have been outputted from the first horizontal output circuit 162 and the second photoelectrically converted signals that have been outputted from the second horizontal output circuit 163 are sent to the focus detection unit 12a and to the image generation unit 12b via the buffer memory 16 shown in FIG. 1, and the focus detection unit 12a performs phase difference focus detection calculation on the basis of the first and second photoelectrically converted signals of the first and second photoelectric conversion units 210a, 210b of the m-th row that have been thus simultaneously read out. Moreover, the image generation unit 12b adds together the first and second photoelectrically converted signals of the first and second photoelectric conversion units 210a, 210b of the pixels 210, and thereby generates an image signal.

In this eleventh variant embodiment, in a similar manner to the case with the second image sensor 22, the first photoelectrically converted signals of the first photoelectric conversion units 210a of the plurality of pixels 210 that are arranged upon the same row are simultaneously read out, and also the second photoelectrically converted signals of the second photoelectric conversion units 210b are simultaneously read out. Due to this, as will be described hereinafter, when an image is obtained by combining the first and second photoelectrically converted signals of correspondingly related pixels 210, 220 related to the first and second image sensors 21, 22, it is possible to make the reading out timings of the correspondingly related pixels 210, 220 agree with one another, which makes it possible to enhance the quality of the image that is obtained.

Variant Embodiment #12

In the first embodiment the image generation unit 12b, along with generating the first image signal by adding together the first and second photoelectrically converted signals of the pixels of the first image sensor 21, also generates the second image signal by adding together the first and second photoelectrically converted signals of the pixels of the second image sensor 22. However, in a twelfth variant embodiment, the image generation unit 12b further generates a left eye image signal on the basis of, for example, the first photoelectrically converted signals of the pixels of the first image sensor 21 outputted from the first horizontal output circuit 152, and also a right eye image signal on the basis of, for example, the second photoelectrically converted signals of the pixels outputted from the second horizontal output circuit 153, thereby generates a first stereoscopic image signal. And, in a similar manner, the image generation unit 12b also generates a left eye image signal on the basis of, for example, the first photoelectrically converted signals of the pixels of the second image sensor 22 outputted from the first horizontal output circuit 162, and also a right eye image signal on the basis of, for example, the second photoelectrically converted signals of the pixels outputted from the second horizontal output circuit 163, thereby generates a second stereoscopic image signal.

The image processing unit 14 performs various types of image processing upon the first and second stereoscopic image signals from the image generation unit 12b, such as interpolation processing, compression processing, white balance processing and so on, and thereby generates first and second stereoscopic image data. This first and second stereoscopic image data may be displayed upon the monitor 15, and/or may be stored upon the memory card 17.

Next, reproduction of the first and second stereoscopic image data will be explained. The first stereoscopic image signal due to the first and second photoelectrically converted signals from the first image sensor 21 has a parallax in the column direction of the pixels of the image sensor, in other words in the direction parallel to first and second pupil regions of the pupil of the photographic optical system 10. In a similar manner, the second stereoscopic image signal due to the first and second photoelectrically converted signals from the second image sensor 22 has a parallax in the row direction of the pixels of the image sensor, in other words in the direction parallel to third and fourth pupil regions of the pupil of the photographic optical system 10.

Thus, when the face of the observer is upright or erect, the monitor 15 shown in FIG. 1 displays a stereoscopic image on the basis of the second stereoscopic image signal which has a parallax in the row direction; and conversely, when the face of the observer is tilted sideways as for example when the observer is lying down, the monitor 15 displays a stereoscopic image on the basis of the first stereoscopic image signal which has a parallax in the column direction.

It should be understood that, in order to change over the stereoscopic image that is displayed according to the inclination of the face of the observer in this manner, it will be acceptable, for example, to install an external imaging device to the monitor 15, to capture an image of the face of the observer with this imaging device, to recognize the face of the observer with a per se known face recognition unit that is provided to the control unit 12 of FIG. 1, to detect the direction in which the left and right eyes in the face that has thus been recognized are aligned, and to make the decision as to whether the face of the observer is erect or is horizontally oriented on the basis of this eye alignment direction. The changing over of the display of the stereoscopic image according to the inclination of the face of the observer as described above may also be implemented upon some monitor other than the monitor 15. For example, it would also be possible to transfer the first and second stereoscopic image signals to a personal computer or the like, and to change over the stereoscopic image upon the monitor of this personal computer between a stereoscopic image based upon the first stereoscopic image signal and a stereoscopic image based upon the second stereoscopic image signal, according to the angle of inclination of the face of the observer.

Since, as has been described above, according to this variant embodiment, first and second stereoscopic image signals having parallaxes in mutually different directions are generated, accordingly it is possible to change over the stereoscopic image display according to the angle of inclination of the face of the observer, and due to this, for example, it becomes possible to provide an effective stereoscopic view, irrespective of whether the face of the observer is erect or is horizontal.

Embodiment #2

FIG. 17 is a figure showing the fundamental concept of a second embodiment. While, in the first embodiment described above, with the pixels 210 of the first image sensor 21, the image signal is generated by adding together the first and second photoelectrically converted signals of the first and second photoelectric conversion units 210a, 210b, here, since as shown in FIG. 17(*a*) the first and second photoelectric conversion units 210a, 210b are arranged with a gap 210c, accordingly the light flux that is incident upon this gap 210c is not photoelectrically converted. In other words, in the pixel 210, a neutral zone region 210c is created in relation to the incident light flux. In a similar manner, with the pixels 220 of the second image sensor 22 as well, the image signal is generated by adding together the first and second photoelectrically converted signals of the first and second photoelectric conversion units 220a, 220b, but since as shown in FIG. 17(*b*) the first and second photoelectric conversion units 220a, 220b are arranged with a gap 220c, accordingly this gap 220c becomes a neutral zone region in relation to the light flux that is incident upon the pixel 220. However, in this second embodiment, it is arranged to reduce the size of this type of neutral zone region related to the image signals.

As shown in FIG. 17(*c*), when a pixel 210 of the image sensor 21 and a pixel 220 of the image sensor 22 that are in a corresponding relationship are shown as mutually superimposed, the first and second photoelectric conversion units 220a, 220b of the pixel 220 of the second image sensor 22 are present in the greater portion of the neutral zone region 210c of the pixel 210 of the first image sensor 21, and similarly the first and second photoelectric conversion units 210a, 210b of the pixel 210 of the first image sensor 21 are present in the greater portion of the neutral zone region 220c of the pixel 220 of the second image sensor 22. Accordingly, as shown in FIG. 17(*c*), the entire neutral zone region of the pixel 210 and the pixel 220 which are in a relationship of correspondence becomes the portion 291 in which the neutral zone region 210c and the neutral zone region 220c overlap, in other words becomes the extremely small region shown by hatching.

Figure 18:
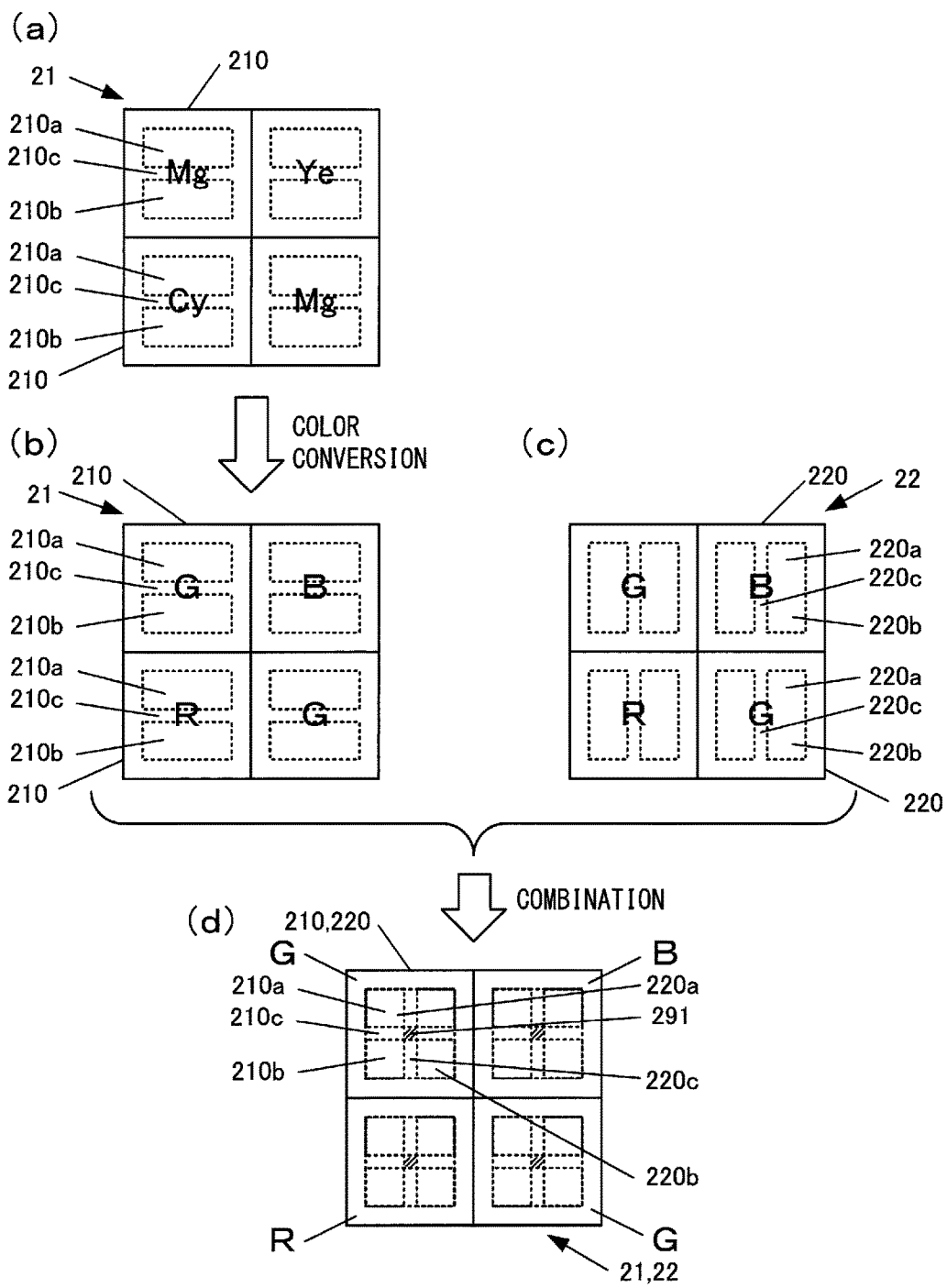
FIG. 18 is a figure showing a method for combination of first and second photoelectrically converted signals of pixels that are in a relationship of mutual correspondence relating to the first and second image sensors according to this second embodiment.

FIG. 18 is a figure relating to the first and second image sensors 21, 22 according to this second embodiment, and shows a method for combination of the first and second photoelectrically converted signals of the pixels 210, 220 that are in a relationship of mutual correspondence. Here, FIG. 18(*a*) shows two rows by two columns of pixels which are a portion of the pixels of the first image sensor 21, these being a "Mg" pixel 210, a "Ye" pixel 210, a "Cy" pixel 210, and another "Mg" pixel 210; and FIG. 18(*c*) shows two rows by two columns of pixels which are a portion of the pixels of the second image sensor 22, these being a "G" pixel 220, a "R" pixel 220, a "B" pixel 220, and another "G" pixel 220, and being respectively in correspondence relationships with the two rows by two columns of pixels 210 of the first image sensor 21 shown in FIG. 18(*a*).

As shown in FIG. 18(*a*), the "Cy" pixel 210, the two "Mg" pixels 210, and the "Ye" pixel 210 of the first image sensor 21 output CMY image signals, and these CMY image signals are converted into RGB image signals according to per se known color system conversion processing by the image processing unit 14 shown in FIG. 1. The RGB image signals generated by this color system conversion processing are regarded, considering the relationship between the RGB image signals and the pixels 210, as though the "Mg" pixels 210 shown in FIG. 18(*a*) output a G signal, as though the "Ye" pixel 210 outputs a B signal, and as though the "Cy" pixel 210 outputs an R signal. FIG. 18(*b*) shows the relationship between the RGB image signals and the pixels 210.

The image processing unit 14 shown in FIG. 1 adds together the image signals of the pixels 210 of the first image sensor 21 shown in FIG. 18(*b*) and the image signals of the pixels 220 of the second image sensor 22 shown in FIG. 18(*c*) which are in correspondence relationships therewith. In other words, in FIGS. 18(*b*) and 18(*c*), the image processing unit 14 adds together the G signals from the upper left pixels 210, 220 to generate an added G signal, adds together the B signals from the upper right pixels 210, 220 to generate an added B signal, adds together the R signals from the lower left pixels 210, 220 to generate an added R signal, and adds together the G signals from the lower right pixels 210, 220 to generate another added G signal. Of course, instead of adding these various sets of signals together, it would also be acceptable to average them together.

FIG. 18(d) is a figure showing the pixels 210 of the image sensor 21 and the pixels 220 of the image sensor 22 that are in correspondence relationships therewith as mutually superimposed, and schematically shows the relationships of the added signals of the overlapped pixels 210, 220. The neutral zones related to the added R, G, and B signals become the regions 291 shown by hatching in FIG. 18(d), and can be made to be extremely small.

Embodiment #3

The way in which rolling shutter distortion is corrected in a third embodiment will now be explained.

FIG. 19 is a figure for explanation of the theory of this third embodiment. As described above, the photoelectrically converted signals of the first and second photoelectric conversion units 210a, 210b of the pixels 210 of the first image sensor 21 are read out for each column sequentially in order, while the photoelectrically converted signals of the first and second photoelectric conversion units 220a, 220b of the pixels 220 of the second image sensor 22 are read out for each row sequentially in order. Due to this, when the photographic subject is moving, so called rolling shutter distortion may undesirably take place in the moving image of the photographic subject that is captured.

For example, when the image of a square photographic subject is captured while maintaining the attitude of the digital camera 1 so that the row directions of the first and second image sensors 21, 22 remain horizontal, no distortion takes place in either of the images 181 of the photographic subject in the images 180 that are obtained by image capture by the first and second image sensors 21, 22 as shown in FIG. 19(a) if the photographic subject is stationary. However, if the photographic subject is moving in the horizontal direction, and if the readout circuit for the first image sensor 21 is the readout circuit shown in FIG. 5, then the length in the horizontal direction of the image 181 of the photographic subject that is captured by the first image sensor 21 changes according to the direction of moving, as shown in FIG. 19(b) or FIG. 19(c). In other words, when the moving direction of the photographic subject is in the direction of the arrow sign shown in FIG. 19(b) (i.e. the subject is moving in the rightward direction), then the image 181 of the photographic subject is expanded; whereas, when the moving direction of the photographic subject is in the direction of the arrow sign shown in FIG. 19(c) (i.e. the subject is moving in the leftward direction), then the image 181 of the photographic subject is shortened. Furthermore, if the readout circuit for the second image sensor 22 is the readout circuit shown in FIG. 6, then the image 181 of the photographic subject that is captured by the second image sensor 22 is skewed as shown in FIG. 19(d) or FIG. 19(e), and this is not desirable.

Figure 20:
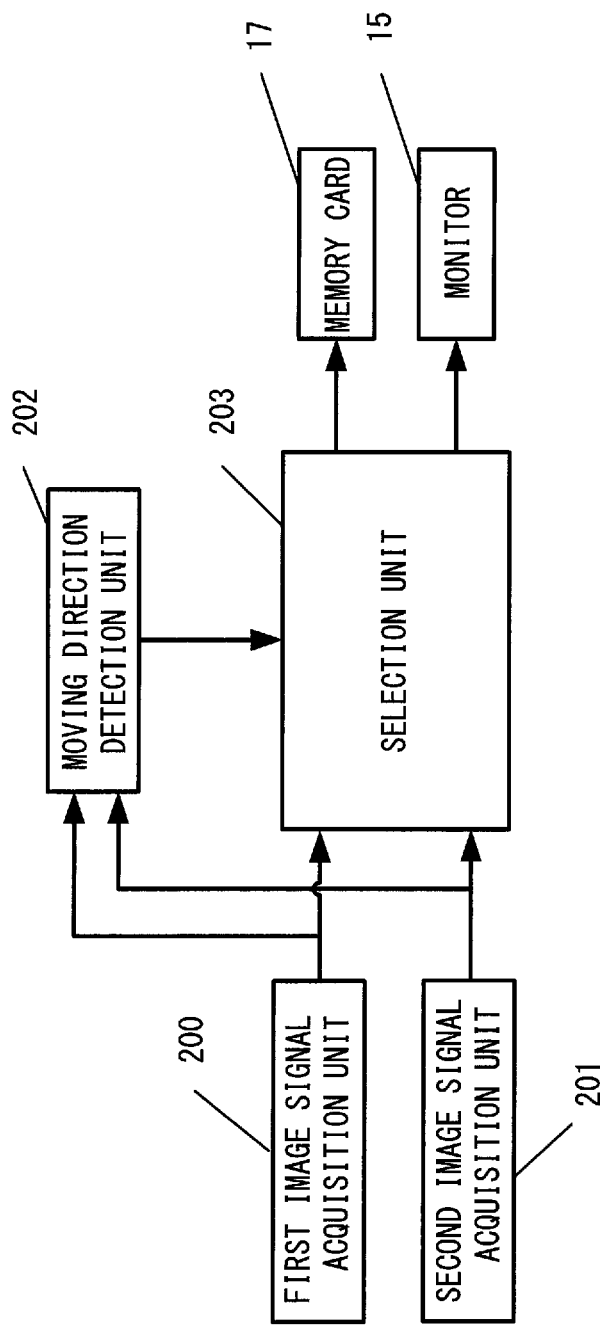
FIG. 20 is a block diagram of this third embodiment.

FIG. 20 is a block diagram showing the third embodiment. A first image signal acquisition unit 200 sequentially acquires the image signals that are repeatedly outputted from the first image sensor 21, and a second image signal acquisition unit 201 acquires the image signals that are repeatedly outputted from the second image sensor 22. A moving direction detection unit 220 detects the direction of moving of a moving photographic subject on the basis of the image signal from the first image signal acquisition unit 200 and the image signal from the second image signal acquisition unit 201. This detection of the direction of moving can be obtained by comparing together the image signals that are repeatedly outputted. And the moving direction detection unit 202 could also detect the moving direction on the basis of the image signal from one of the first image signal acquisition unit 200 and the second image signal acquisition unit 201.

A selection unit 203 selects the image signal from the first image signal acquisition unit 200 or the image signal from the second image signal acquisition unit 201 on the basis of the moving direction of the photographic subject as detected by the moving direction detection unit 202. In concrete terms, if the direction of moving of the photographic subject is the horizontal direction, then the selection unit 203 selects the image signal from the first image signal acquisition unit 200, in other words the image signal of the first image sensor 21; whereas, if the direction of moving of the photographic subject is the vertical direction, then it selects the image signal from the second image signal acquisition unit 201, in other words the image signal of the second image sensor 22. The image signal that has been selected by the selection unit 203 is either displayed upon the monitor 15 or stored upon the memory card 17. Because of doing this, the image signal selected by the selection unit is not an image having skew distortion, like the images of FIG. 19(d) or FIG. 19(e), but becomes an image signal in which there is no skew distortion, like the images of FIG. 19(b) or FIG. 19(c).

Furthermore, for example, it would also be acceptable to arrange to provide a structure which generates an image in which this rolling shutter distortion is corrected by using the image 181 of the photographic subject shown in FIG. 19(b) or FIG. 19(c), the image 181 of the photographic subject shown in FIG. 19(d) or FIG. 19(e), and the photographic subject shifting direction information. In other words, for example, along with detecting an angle α of a specific portion of the image 181 of the photographic subject in which no skew distortion such as shown in FIG. 19(b) or FIG. 19(c) is present, also an angle θ is detected of that specific portion of the image 181 of the photographic subject in which skew distortion such as shown in FIG. 19(d) or FIG. 19(e) is present. And a photographic subject image in which no skew distortion is present is generated by comparing together these angles α and θ to calculate the angle that originates in skew distortion, and by correcting for this angle that originates in skew distortion.

It should be understood that the embodiments and/or variant embodiments described above may also be combined with one another.

While various embodiments and variant embodiments have been explained in the above description, the present invention is not to be considered as being limited by the details thereof. Other aspects that are considered to come within the scope of the technical concept of the present invention are also included within the range of the present invention.

The contents of the disclosure of the following application, upon which priority is claimed, are hereby incorporated herein by reference:

Japanese Patent Application 71,017 of 2015 (filed on 31 Mar. 2015).

REFERENCE SIGNS LIST

1: digital camera, 10: photographic optical system, 11: image capturing unit, 12: control unit, 21: first image sensor, 22, 23: second image sensors, 210, 220: pixels, 210a: first photoelectric conversion unit, 210b: second photoelectric conversion unit, 220a: first photoelectric conversion unit, 220b: second photoelectric conversion unit, 151: column scan circuit, 152: first horizontal output circuit, 153: second horizontal output circuit, 161: row scan circuit, 162: first horizontal output circuit, 163: second horizontal output circuit, 233: micro lens, 233F: focal point, 234: inner lens.

The invention claimed is:

1. An imaging device, comprising:
an image sensor that includes:
a first pixel that comprises a first photoelectric conversion unit and a second photoelectric conversion unit that are arranged in a first direction and generate electric charges by photoelectrically converting incident light; and
a second pixel that comprises a third photoelectric conversion unit and a fourth photoelectric conversion unit that are arranged in a second direction that is different from the first direction and generate electric charges by photoelectrically converting light that has passed through the first pixel;
an attitude detector that detects an attitude of the imaging device; and
a controller that includes a processor and executes:
to control a focusing position of an optical system based upon results of detection by the attitude detector and at least one of a first signal and a second signal, or a third signal and a fourth signal, with the first signal being based upon the electrical charges generated by the first photoelectric conversion unit, the second signal being based upon the electrical charges generated by the second photoelectric conversion unit, the third signal being based upon the electrical charges generated by the third photoelectric conversion unit, and the fourth signal being based upon the electrical charges generated by the fourth photoelectric conversion unit.

2. The imaging device according to claim 1, wherein:
the first pixel photoelectrically converts light of a first color among incident light; and
the second pixel photoelectrically converts light of a complementary color to the first color.

3. The imaging device according to claim 1, further comprising:
a plurality of first pixels that are arranged in the second direction;
a plurality of second pixels that are arranged in the first direction;
a first readout unit that reads out signals from the plurality of first pixels; and
a second readout unit that reads out signals from the plurality of second pixels.

4. The imaging device according to claim 1, further comprising:
a first signal line that outputs the first signal that is based upon the electrical charges generated by the first photoelectric conversion unit;
a second signal line that outputs the second signal that is based upon the electrical charges generated by the second photoelectric conversion unit;
a third signal line that outputs the third signal that is based upon the electrical charges generated by the third photoelectric conversion unit; and
a fourth signal line that outputs the fourth signal that is based upon the electrical charges generated by the fourth photoelectric conversion unit.

5. The imaging device according to claim 4, further comprising:
a first addition unit that adds the first signal and the second signal; and
a first output line that outputs signal added by the first addition unit.

6. The imaging device according to claim 4, further comprising:
a second addition unit that adds the third signal and the fourth signal; and
a second output line that outputs a signal added by the second addition unit.

7. The imaging device according to claim 1, wherein:
the first pixel comprises a micro-lens;
the first photoelectric conversion unit and the second photoelectric conversion unit photoelectrically convert light that has passed through the micro-lens; and
the third photoelectric conversion unit and the fourth photoelectric conversion unit photoelectrically convert light that has passed through the micro-lens and the first pixel.

8. The imaging device according to claim 1, further comprising:
a micro-lens disposed at a light incident side rather than the first pixel; and
a lens disposed between the first pixel and the second pixel.

9. The imaging device according to claim 1, wherein the first through fourth photoelectric conversion units are organic photoelectric sheets.

10. The imaging device according to claim 1, wherein the controller executes to select at least one of the first signal and the second signal or the third signal and the fourth signal based upon at least one of a first image based upon the first signal and the second signal, and a second image based upon the third signal and the fourth signal, and to control the focusing position of the optical system.

11. The imaging device according to claim 10, wherein the controller executes to select at least one of the first signal and the second signal or the third signal and the fourth signal based upon a contrast of the first image and a contrast of the second image, and to control the focusing position of the optical system.

12. The imaging device according to claim 11, wherein the controller executes to control the focusing position of the optical system based upon at least one of the first signal and the second signal or the third signal and the fourth signal, with the contrast of the first image and the contrast of the second image being more than or equal a first threshold value.

13. The imaging device according to claim 11, wherein the controller executes to control the focusing position of the optical system based upon at least one of the first signal and the second signal or the third signal and the fourth signal, with the contrast of the first image and the contrast of the second image being less than a second threshold value.

14. The imaging device according to claim 11, wherein the controller executes to control the focusing position of the optical system based upon at least one of the first signal and the second signal or the third signal and the fourth signal, with a difference between the contrast of the first image and the contrast of the second image being more than or equal to a second threshold value.

15. The imaging device according to claim 10, wherein the controller executes to control the focusing position of the optical system based upon the third signal and the fourth signal with a cycle pattern image being included in the first image, and to control the focusing position of the optical system based upon the first signal and the second signal with a cycle pattern image being included in the second image.

16. The imaging device according to claim 1, wherein the controller executes to select at least one of the first signal and the second signal or the third signal and the fourth signal based upon the results of detection by the attitude detector, and to control the focusing position of the optical system.

17. The imaging device according to claim 1, wherein: the controller:
   generates an image signal based upon the first signal and the second signal and generates an image signal based upon the third signal and the fourth signal; and
   generates an image signal based upon the image signal generated by adding the first signal and the second signal and the image signal generated by adding the third signal and the fourth signal.

18. The imaging device according to claim 1, wherein the controller:
   detects a moving direction of a photographic subject according to at least one of the first signal and the second signal or the third signal and the fourth signal; and
   based upon the moving direction, generates an image signal based upon the first signal and the second signal, or based upon the third signal and the fourth signal.

19. The imaging device according to claim 18, wherein the controller generates an image signal by correcting the image signal based upon the first signal and the second signal or the image signal based upon the third signal and the fourth signal, based upon the detected moving direction.

* * * * *